United States Patent
Yoshida et al.

(10) Patent No.: US 8,445,925 B2
(45) Date of Patent: May 21, 2013

(54) SEMICONDUCTOR OPTICAL DEVICE

(75) Inventors: Takahisa Yoshida, Itami (JP); Yohei Enya, Itami (JP); Takashi Kyono, Itami (JP); Masaki Ueno, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/434,230

(22) Filed: Mar. 29, 2012

(65) Prior Publication Data

US 2012/0273816 A1 Nov. 1, 2012

(30) Foreign Application Priority Data

Mar. 29, 2011 (JP) ................... P2011-072540

(51) Int. Cl.
*H01L 33/00* (2010.01)
*H01L 29/201* (2006.01)

(52) U.S. Cl.
USPC .......... 257/90; 257/94; 257/95; 257/E33.025; 257/E33.014

(58) Field of Classification Search
USPC ............... 257/90, 94, 95, E33.025, E33.014
See application file for complete search history.

(56) References Cited

U.S. PATENT DOCUMENTS 7,633,987 B2 * 12/2009 Kashima et al. ......... 372/50.121

FOREIGN PATENT DOCUMENTS

| JP | 2000-011417 | | 1/2000 |
| JP | 2003-101156 | A | 4/2003 |
| JP | 2006-135306 | A | 5/2006 |
| JP | 2006-135323 | A | 5/2006 |
| JP | 2008-294322 | A | 12/2008 |
| JP | 2010-109147 | A | 5/2010 |
| JP | 4475358 | B1 | 6/2010 |
| JP | 2011-077341 | A | 4/2011 |

OTHER PUBLICATIONS

Funato et al., "Tailored emission color synthesis using microfacet quantum wells consisting of nitride semiconductors without phosphors," Applied Physics Letters, vol. 88, pp. 261920-1-261920-3 (2006).

* cited by examiner

*Primary Examiner* — Tu-Tu Ho
(74) *Attorney, Agent, or Firm* — Venable LLP; Michael A. Sartori

(57) ABSTRACT

A semiconductor optical device includes: a group III nitride semiconductor substrate having a primary surface of a first orientation; a first group III nitride semiconductor laminate including a first active layer disposed on a first region of the primary surface; a group III nitride semiconductor thin film having a surface, which has a second orientation different from the first orientation, disposed on a second region, the second region being different from the first region; a junction layer provided between the second region and the group III nitride semiconductor thin film; and a second group III nitride semiconductor laminate including a second active layer and disposed on the surface of the group III nitride semiconductor thin film. The first and second active layers include first and second well layers containing In, respectively, and the emission wavelengths of the first and second well layers are different from each other.

20 Claims, 17 Drawing Sheets

SEMICONDUCTOR OPTICAL DEVICE

BACKGROUND OF THE INVENTION

1. Field of the Invention

The present invention relates to a semiconductor optical device.

2. Related Background Art

Light-emitting devices which emit light of multiple wavelengths are now being developed. For example, Patent Literature 1 discloses a semiconductor laser array, and the semiconductor laser array emits beams, which are different from each other, having two lasing wavelengths of 650 nm and 780 nm. The semiconductor laser array includes a GaAs substrate, a laser device portion which emits 650-nm laser light, and a laser device portion which emits 780-nm laser light. These two laser device portions are mounted on the GaAs substrate.

Patent Literature 2 discloses a multi-wavelength laser diode device that includes a plate on which at least three laser diodes having different lasing wavelengths are disposed. The three laser diodes are aligned in parallel on the surface of the plate. At least one of the three laser diodes is formed to use crystal growth on a GaN substrate, and the remaining laser diode(s) is formed on a GaAs substrate by crystal growth.

Patent Literature 3 discloses a multi-wavelength laser diode device which includes a structure in which at least three laser diodes of different lasing wavelengths are bonded onto a plate to form respective junctions. The three laser diodes are stacked on the plate. At least one of the three laser diodes is formed on a GaN substrate by crystal growth, and the remaining diode(a) is formed on a GaAs substrate by crystal growth.

Patent Literature 4 discloses a multi-wavelength laser diode device which includes three laser diodes of different lasing wavelengths bonded onto a plate to form respective junctions. The three laser diodes are aligned on a GaN substrate. At least one of the three laser diodes is formed on the GaN substrate by crystal growth, and the other laser diodes are formed on a GaAs substrate by crystal growth.

Non-Patent Publication 1 discloses a light-emitting device including three different facets formed on a GaN base and LEDs formed over these facets by crystal growth. The LEDs have different compositions of In constituent due to the different facets, and thus, their emission wavelengths are also different from each other.

Patent Literature 1: Japanese Patent Application Laid-open No. 2000-011417
Patent Literature 2: Japanese Laid-open Patent Application Publication No. 2006-135306
Patent Literature 3: Japanese Laid-open Patent Application Publication No. 2006-135323
Patent Literature 4: Japanese Laid-open Patent Application Publication No. 2008-294322
Non-Patent Literature 1: M. Funato et al., "Tailored emission color synthesis using microfacet quantum wells consisting of nitride semiconductors without phosphors," Applied Physics Letters 88, 261920 (2006)

SUMMARY OF THE INVENTION

Group III nitrides, such as GaN, are materials that can emit light in a wide wavelength band. Light-emitting portions having wavelengths significantly different from each other can be formed on a single group III nitride semiconductor substrate. The device structure which light-emitting devices are die-bonded onto a single plate as described in Patent Literatures 2-4, however, makes it difficult to reduce the device size. Further, assembling a number of laser diodes with similar alignment precision increases assembly costs.

It is an object of the present invention to provide a semiconductor optical device of a small size, which can be easily fabricated and emit light of multiple-wavelength.

According to one aspect of the present invention, a semiconductor optical device includes: a group III nitride semiconductor substrate including a surface, the surface having a first orientation; a first group III nitride semiconductor laminate including a first active layer and grown on a first region of the primary surface; a group III nitride semiconductor thin film including a surface, the surface thereof having a second orientation different from the first orientation, the group III nitride semiconductor thin film being joined to a second region of the primary surface using a junction layer therebetween, the second region being different from the first region; and a second group III nitride semiconductor laminate including a second active layer and grown on the surface of the group III nitride semiconductor thin film. The first active layer includes a first well layer containing indium; the second active layer includes a second well layer containing indium, and an emission wavelength of the first well layer is different from that of the second well layer.

In the semiconductor optical device, the orientation of the primary surface of the group III nitride semiconductor substrate is different from the orientation of the surface of the group III nitride semiconductor thin film. The first group III nitride semiconductor laminate may be grown over the group III nitride semiconductor substrate, and the second group III nitride semiconductor laminate may be grown over the group III nitride semiconductor thin film. In this configuration, for example, although the growth condition of the first well layer is the same as the growth condition of the second well layer, the emission wavelengths of the first and second well layers can be made different from each other depending upon their amounts of incorporated indium. Thus, in the semiconductor optical device, plural light emitting sections having different emission wavelengths (first and second group III nitride semiconductor laminates) can be easily produced. Since the first and second group III nitride semiconductor laminates are grown over a single substrate (group III nitride semiconductor substrate), the size of the semiconductor optical device can be reduced as compared with a structure including plural light emitting devices die-bonded on a plate.

The semiconductor optical device can be configured to the following: an indium content of the first well layer can be different from an indium content of the second well layer. In the above-described semiconductor optical device, the orientation of the primary surface of the group III nitride semiconductor substrate is different from the orientation of the surface of the group III nitride semiconductor thin film, facilitating the production of the first and second well layers having different In contents. This configuration enables the emission wavelengths the first and second well layers to differ from each other.

The semiconductor optical device can be configured to the following: the first group III nitride semiconductor laminate includes a first optical guide layer disposed along the first active layer; the second group III nitride semiconductor laminate includes a second optical guide layer disposed along the second active layer; the first optical guide layer and the second optical guide layer contain indium; and an indium content of the first optical guide layer is different from an indium content of the second optical guide layer.

The semiconductor optical device can be configured to the following: the emission wavelengths of the first and second well layers may be within a range of 430 to 480 nm.

The semiconductor optical device can be configured to the following: the wavelength of one of the first and second well layers may be in a range of 500 to 550 nm.

The semiconductor optical device can be configured to the following: the emission wavelength of the first well layer may be within a range of 500 to 550 nm, and the emission wavelength of the second well layer may be in a range of 430 to 480 nm.

The semiconductor optical device can be configured to the following: the first group III nitride semiconductor laminate has an optical waveguide structure for lasing; a normal vector of the primary surface of the group III nitride semiconductor substrate is inclined toward a c-axis of a group III nitride semiconductor of the group III nitride semiconductor substrate; and the direction of the c-axis projected onto the primary surface of the group III nitride semiconductor substrate is orthogonal to a longitudinal direction of the optical waveguide structure of the first group III nitride semiconductor laminate. When the first group III nitride semiconductor laminate has such a laser device structure, the cleaving facets can be used as end faces for the cavity of the laser device structure because the tilt direction of the primary surface of the group III nitride semiconductor substrate that is defined with respect to the c-axis is orthogonal to the waveguide. Hence, excellent lasing characteristics can be achieved.

The primary surface of the group III nitride semiconductor substrate of the semiconductor optical device may have a semipolar plane or a non-polar plane of the group III nitride semiconductor. This surface has a capability to increase the In content that the first well layer can incorporate, thereby achieving emission of light in a green wavelength band such as the range of 500 to 550 nm.

The semiconductor optical device can be configured to the following: the angle formed between a normal vector of the primary surface of the group III nitride semiconductor substrate and the c-axis of the group III nitride semiconductor substrate is preferably in a range of 10 to 80 degrees or 100 to 170 degrees. The semiconductor optical device can be configured to the following: the angle formed between a normal vector of the primary surface of the group III nitride semiconductor substrate and the c-axis of the group III nitride semiconductor substrate is preferably in a range of 63 to 80 degrees or 100 to 117 degrees.

The semiconductor optical device can be configured to the following: the junction layer may be composed of a conductive material.

BRIEF DESCRIPTION OF THE DRAWINGS

The above objects and the other objects, features, and advantages of the present invention will more readily become clear from the following detailed description of the preferred embodiments of the present invention proceeding with reference to the accompanying drawings.

DESCRIPTION OF THE EMBODIMENTS

The expertise of the present invention can be readily understood in view of the following detailed description with reference to the accompanying drawings provided by way of illustration only. The below will describe embodiments of a semiconductor optical device according to the present invention, with reference to the accompanying drawings. The same portions will be denoted by the same reference signs as much as possible.

(First Embodiment)

Figure 1:
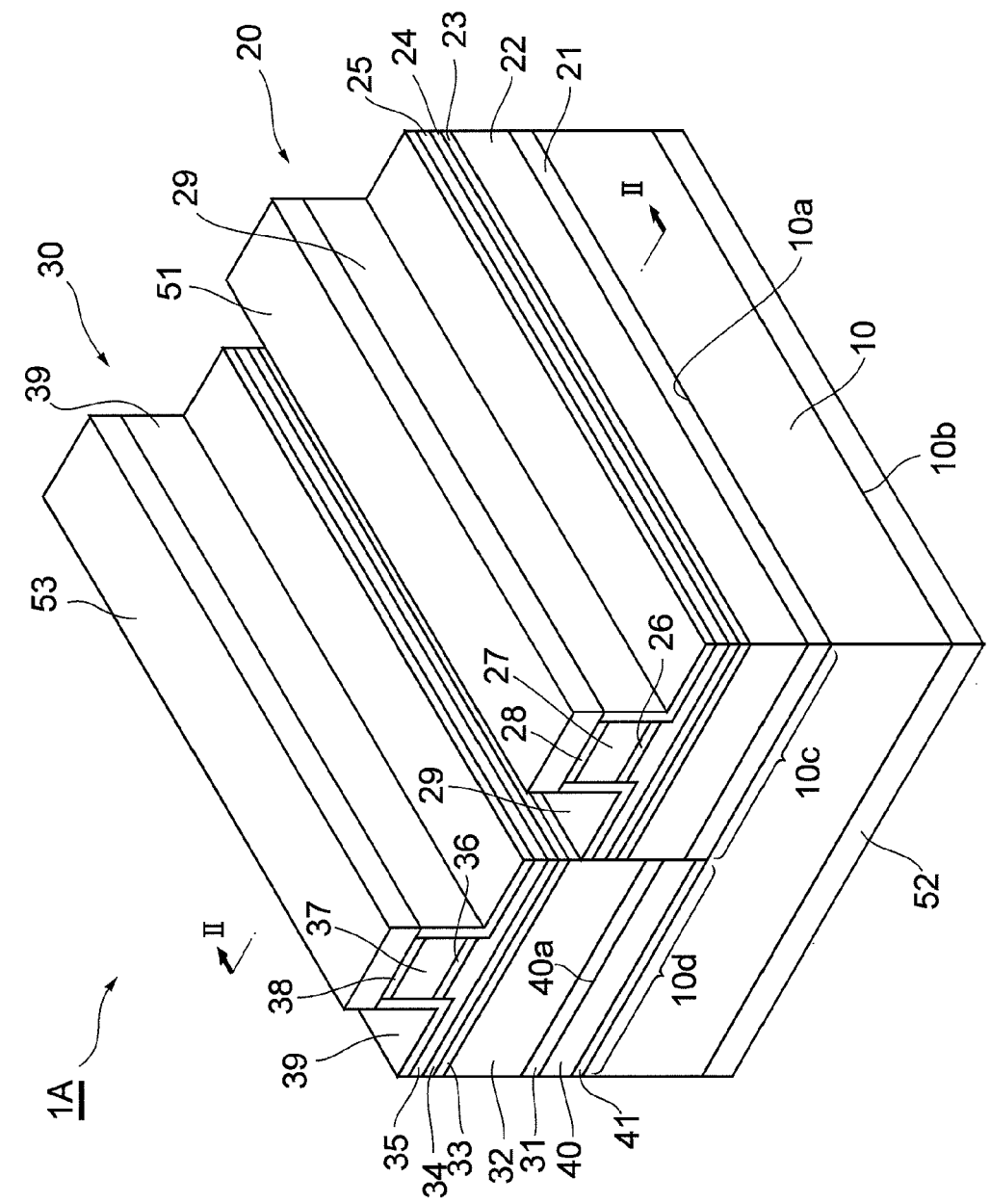
FIG. 1 is a perspective view of a semiconductor laser device (semiconductor laser device 1A) associated with a semiconductor optical device according to a first embodiment of the present invention.
Figure 2:
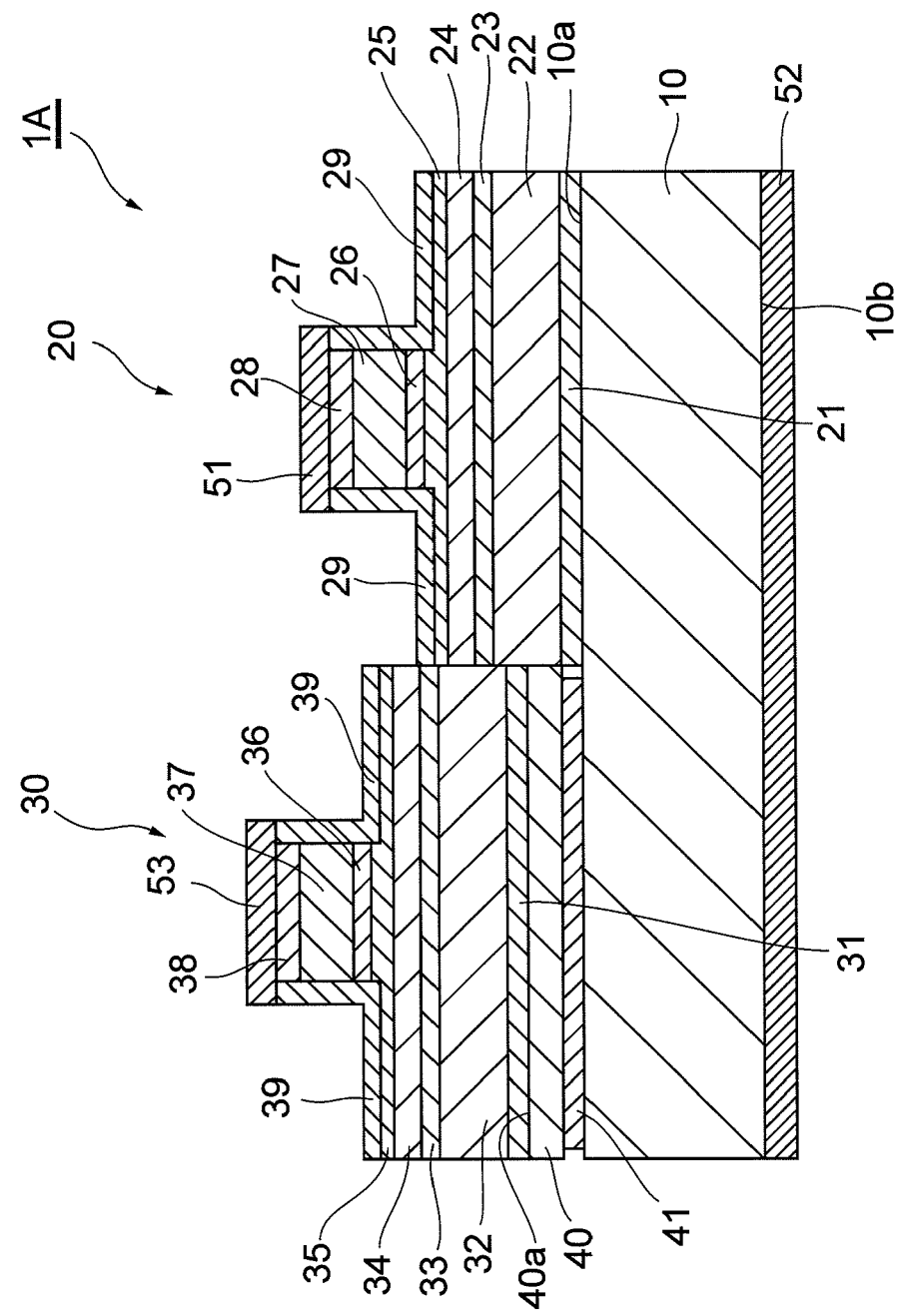
FIG. 2 is a cross-sectional side view, taken along line II-II in FIG. 1, of the semiconductor laser device.

FIG. 1 is a perspective view of a semiconductor laser device 1A associated with a semiconductor optical device according to the first embodiment. FIG. 2 is a cross-sectional side view, taken along line II-II in FIG. 1, of the semiconductor laser device 1A. As illustrated in FIGS. 1 and 2, the semiconductor laser device 1A according to this embodiment includes a GaN substrate 10 which can be used as a group III nitride semiconductor substrate, a laser structure 20 which can be used as a first group III nitride semiconductor laminate, a laser structure 30 which can be used as a second group III nitride semiconductor laminate, and a GaN thin film 40 used as a group III nitride semiconductor thin film.

The GaN substrate 10 is composed of a first conductivity type (for example, n type) GaN single crystal. The GaN substrate 10 has a primary surface 10a and a back surface 10b. The primary surface 10a has a first orientation. The first orientation represents, for example, that the primary surface 10a forms a predetermined angle defined in a predetermined direction away from the c-axis of the GaN crystal. In other words, the c-axis of the GaN crystal constituting the GaN substrate 10 is inclined away from the primary surface 10a. That is the primary surface 10a has a semipolar plane or a nonpolar plane.

The inclination angle of the primary surface 10a of the GaN substrate 10 is defined by the angle between the normal vector of the primary surface 10a and the c-axis. This angle is within the range of 10 to 80 degrees, or within the range of 100 to 170 degrees. This angle range provides the GaN substrate 10 with semipolar nature of the GaN crystal. The inclination angle is preferably within the range of 63 to 80 degrees or within the range of 100 to 117 degrees. This inclination angle range provides an InGaN layer with an In content suitable for a well layer (described below) for emission light within the range of 500 to 550 nm. In this embodiment, the primary surface 10a is inclined at a tilt angle of 75 degrees toward the m axis direction.

A cathode 52 may be provided on the entire back surface 10b of the GaN substrate 10. The cathode 52 is, for example, composed of a Ti/Al film and is in ohmic contact with the GaN substrate 10.

The laser structure 20 has a semiconductor layer structure for a laser diode and is formed on a first region 10c of the primary surface 10a by a crystal growth method. The width (length defined in a direction orthogonal to the direction of the waveguide for the laser beam) of the first region 10c is, for example, 1 mm. The laser structure 20 according to this embodiment includes a buffer layer 21, a lower cladding layer 22, a lower optical guiding layer 23, an active layer 24, an upper optical guiding layer 25, an electron blocking layer 26, an upper cladding layer 27, and a contact layer 28, which are arranged on the primary surface 10a in this order.

The buffer layer 21 is in contact with the primary surface 10a and is composed of, for example, n-type GaN. The buffer layer 21 has a thickness of, for example, 500 nm. The lower cladding layer 22 is provided on the buffer layer 21 and is composed of, for example, n-type $In_{0.02}Al_{0.09}Ga_{0.89}N$. The lower cladding layer 22 has a thickness of, for example, 1.5 μm. The lower optical guiding layer 23 and the upper optical guiding layer 25 are comprehensively referred to as "first optical guiding layer" in this embodiment. The lower optical guiding layer 23 is provided on the lower cladding layer 22 along the active layer 24. The upper optical guiding layer 25 is formed on the lower optical guiding layer 23 along the active layer 24. The lower optical guiding layer 23 and the upper optical guiding layer 25 are composed of, for example, undoped $In_{0.03}Ga_{0.97}N$. Preferably, the thickness values of these layers are, for example, 200 nm. The electron blocking layer 26 is provided on the upper optical guiding layer 25 and is composed of, for example, p-type $Al_{0.12}Ga_{0.88}N$. The electron blocking layer 26 has a thickness of, for example, 20 nm. The upper cladding layer 27 is provided on the electron blocking layer 26 and is composed of, for example, p-type $In_{0.02}Al_{0.09}Ga_{0.89}N$. The upper cladding layer 27 has a thickness of, for example, 400 nm. The contact layer 28 is provided on the upper cladding layer 27 and is composed of, for example, p-type GaN. The contact layer 28 has a thickness of, for example, 50 nm.

The active layer 24 is referred to as a first active layer in this embodiment. The active layer 24 is provided between the lower optical guiding layer 23 and the upper optical guiding layer 25. The active layer 24 may have a quantum well structure. If required, the quantum well structure may include well layers (for example, first well layers) and barrier layers which are alternately arranged. The well layer may be composed of a group III-V compound semiconductor containing In, such as InGaN. The barrier layer may be composed of a group III-V compound semiconductor, such as InGaN or GaN, having band gap energy greater than that of the well layer. In this embodiment, the well layer (InGaN) has a thickness of, for example, 3 nm, and the barrier layer (GaN) has a thickness of, for example, 15 nm. The emission wavelength of the active layer 24 is controllably defined by the band gap of the well layer, the In composition of the well layer, the thickness of the well layer, and other factors. The active layer 24 may have an In composition which enables the active layer 24 to emit green light having a peak wavelength in the range of 500 to 550 nm. In this case, the composition of the well layer can be shown as, for example, $In_{0.3}Ga_{0.7}N$.

The upper optical guiding layer 25, the electron blocking layer 26, the upper cladding layer 27, and the contact layer 28 are processed to constitute a semiconductor structure of a ridge shape in which the direction of an optical propagation is defined as the longitudinal direction. An optical waveguide structure for lasing is formed just below the ridge shaped part. The longitudinal direction of the optical waveguide structure desirably intersects (preferably, orthogonal to) the tilt direction of the c-axis of the GaN substrate 10, which is oblique to the normal vector of the primary surface 10a of the GaN substrate 10. This orientation enables the facets to act as the cavity end faces of the optical waveguide, regardless of the tilt angle, and thus results in excellent lasing characteristics.

The side faces of the semiconductor layers 25 to 28 forming the ridge are covered with an insulating film 29. An anode 51 extending through an opening of the insulating film 29 is provided on the contact layer 28. The anode 51 has a strip shape extending in the direction of the optical waveguide. The anode 51 is composed of, for example, a Ni/Au film and is in ohmic contact with the contact layer 28.

The GaN thin film 40 is composed of first conductivity type (for example, n-type) GaN single crystal. The GaN thin film 40 has a thickness of, for example, 0.5 μm. The GaN thin film 40 is provided on the primary surface 10a of the GaN substrate 10, specifically in a second region 10d of the primary surface 10a, which is different from the first region 10c, and a junction layer 41 is provided between the GaN thin film 40 and the second region 10d of the primary surface 10a of the GaN substrate 10, so that the GaN thin film 40 is joined with the second region 10d with the junction layer 41 being sandwiched therebetween. The junction layer 41 has a thickness, for example, in the range of 100 to 500 nm. The width (length defined in a direction orthogonal to the direction of the waveguide of the laser beam) of the second region 10d is, for example, 1 mm. In this embodiment, the first region 10c and the second region 10d are arranged in a direction intersecting the direction of the optical waveguide. Such a GaN thin film 40 is fabricated through steps such as those described below: the junction layer 41 is selectively formed on the primary surface 10a of the GaN substrate 10 in the second region 10d; after ion implantation to the surface of the GaN crystal or other procedures is carried out to allow easy peel-off, the junction layer 41 is sandwiched between the primary surface 10a and the surface of the GaN crystal to form a junction structure constituted by a GaN crystal and the GaN substrate 10; and the GaN crystal is separated therefrom to form the surface thereof.

The surface 40a of the GaN thin film 40 (which is the surface opposite to the surface joining the junction layer 41) has a second orientation. The second orientation is different from the first orientation of the GaN substrate 10. In the second orientation, for example, the surface 40a slightly tilts from the c-axis of the GaN thin film 40. That is, the surface 40a includes a surface that is either substantially the C plane or a plane having a slight off angle to the C plane (for example, at an angle of two degrees or smaller toward the a-axis).

The laser structure 30 has a semiconductor-layer structure for a laser diode and is formed by crystal growth on the GaN thin film 40. The laser structure 30 according to this embodiment includes a buffer layer 31, a lower cladding layer 32, a lower optical guiding layer 33, an active layer 34, an upper optical guiding layer 35, an electron blocking layer 36, an upper cladding layer 37, and a contact layer 38, all of which are grown on the surface 40a in this order.

The buffer layer 31 is in contact with the surface 40a and is composed of, for example, an n-type GaN. The buffer layer 31 has a thickness of, for example, 500 nm. The lower cladding layer 32 is provided on the buffer layer 31 and is composed of, for example, n-type $In_{0.02}Al_{0.09}Ga_{0.89}N$. The lower cladding layer 32 has a thickness of, for example, 1.5 µm. The lower optical guiding layer 33 and the upper optical guiding layer 35 are comprehensively referred to as "second optical guiding layer" in this embodiment. The lower optical guiding layer 33 is provided on the lower cladding layer 32 along the active layer 34. The upper optical guiding layer 35 is stacked over the lower optical guiding layer 33 along the active layer 34. The lower optical guiding layer 33 and the upper optical guiding layer 35 are composed of, for example, undoped $In_{0.02}Ga_{0.98}N$, and the preferable thickness of these layers is, for example, 200 nm. As described in this example, the In contents (for example, 0.02) of the lower optical guiding layer 33 and the upper optical guiding layer 35 of the laser structure 30 are different from the In contents (for example, 0.03) of the lower optical guiding layer 23 and the upper optical guiding layer 25 of the above-described laser structure 20. This difference in In content is caused by a difference between the orientation of the primary surface 10a of the GaN substrate 10 and the orientation of the surface 40a of the GaN thin film 40.

The electron blocking layer 36 is provided on the upper optical guiding layer 35 and is composed of, for example, p-type $Al_{0.12}Ga_{0.88}N$. The electron blocking layer 36 has a thickness of, for example, 20 nm. The upper cladding layer 37 is provided on the electron blocking layer 36 and is composed of, for example, p-type $In_{0.02}Al_{0.09}Ga_{0.89}N$. The upper cladding layer 37 has a thickness of, for example, 400 nm. The contact layer 38 is provided on the upper cladding layer 37 and is composed of, for example, p-type GaN. The contact layer 38 has a thickness of, for example, 50 nm.

The active layer 34 may be referred to as "second active layer" in this embodiment. The active layer 34 is provided between the lower optical guiding layer 33 and the upper optical guiding layer 35. The structure of the active layer 34 is similar to the structure of the active layer 24 but differs in the following points. That is, in an example structure of the active layer 34, the In composition of the well layer (second well layer) of the active layer 34 is different from the In composition of the well layer of the active layer 24, and is, for example, $In_{0.2}Ga_{0.8}N$. Similar to the optical guiding layers, such a difference in the In composition of the well layers is caused by a difference in plane orientation between the primary surface 10a of the GaN substrate 10 and the surface 40a of the GaN thin film 40. In this embodiment, the above difference in the In composition of the well layers can be used to make a difference between the light-emitting wavelength of the well layer of the active layer 24 and the light-emitting wavelength of the well layer of the active layer 34. As described above, the well layer of the active layer 24 generates green light having a peak wavelength in the range of 500 to 550 nm. The well layer of the active layer 34 generates blue light having a peak wavelength in the range of 430 to 480 nm.

The upper optical guiding layer 35, the electron blocking layer 36, the upper cladding layer 37, and the contact layer 38 constitute a semiconductor structure and are arranged in a ridge shape having an optical waveguide extending in the longitudinal direction. The ridge extends in the direction of the optical waveguide. Just below the ridge portion, an optical waveguide structure for lasing is formed. The side surfaces of the semiconductor layers 35 to 38 forming the ridge are covered with an insulating film 39. An anode 53 is provided on the contact layer 38, which passes through an opening of the insulating film 39. The anode 53 has a strip extending in the direction of the optical waveguide. The anode 53 is composed of, for example, a Ni/Au film and is in ohmic contact with the contact layer 38.

Figure 3:
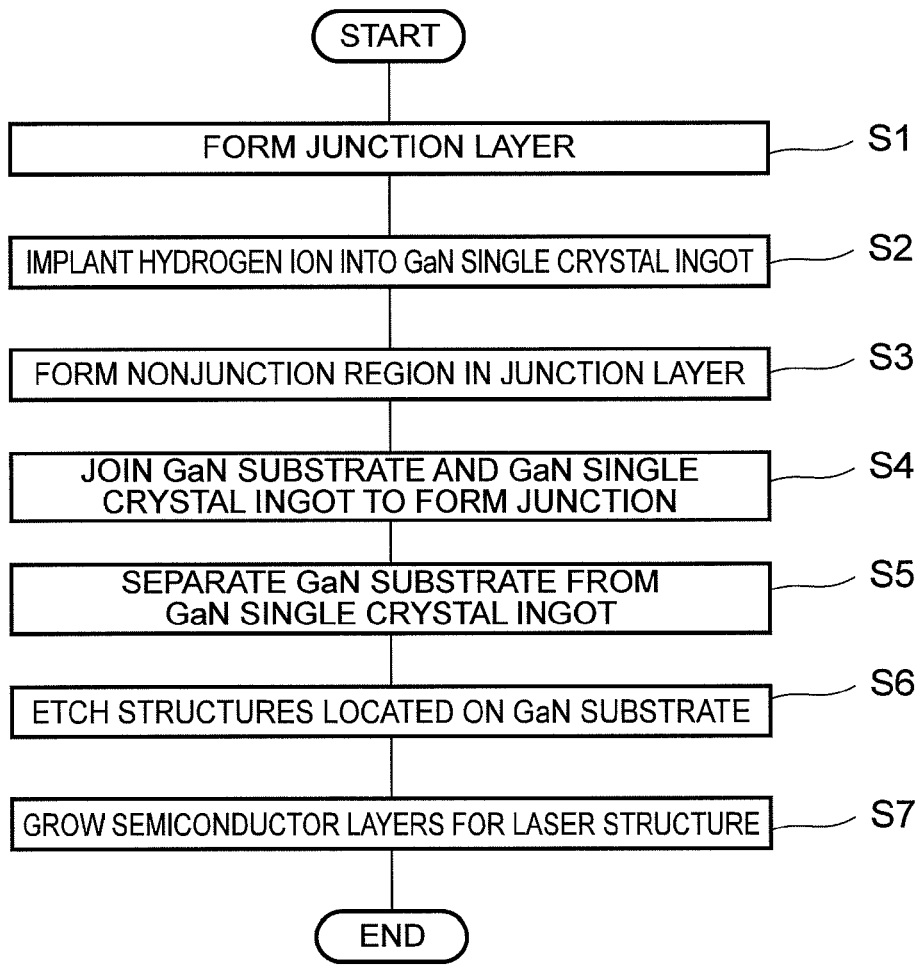
FIG. 3 is a flow chart illustrating a process of fabricating the semiconductor laser device.

The semiconductor laser device 1A, which has the above-described configuration, is fabricated through a fabrication method as described below, for example. FIG. 3 shows a flow chart illustrating a method of fabricating the semiconductor laser device 1A. FIGS. 4 to 7 are cross-sectional views, taken along a plane orthogonal to the direction of the waveguide of the semiconductor laser device 1A, showing the process steps of fabricating the semiconductor device.

Figure 4:
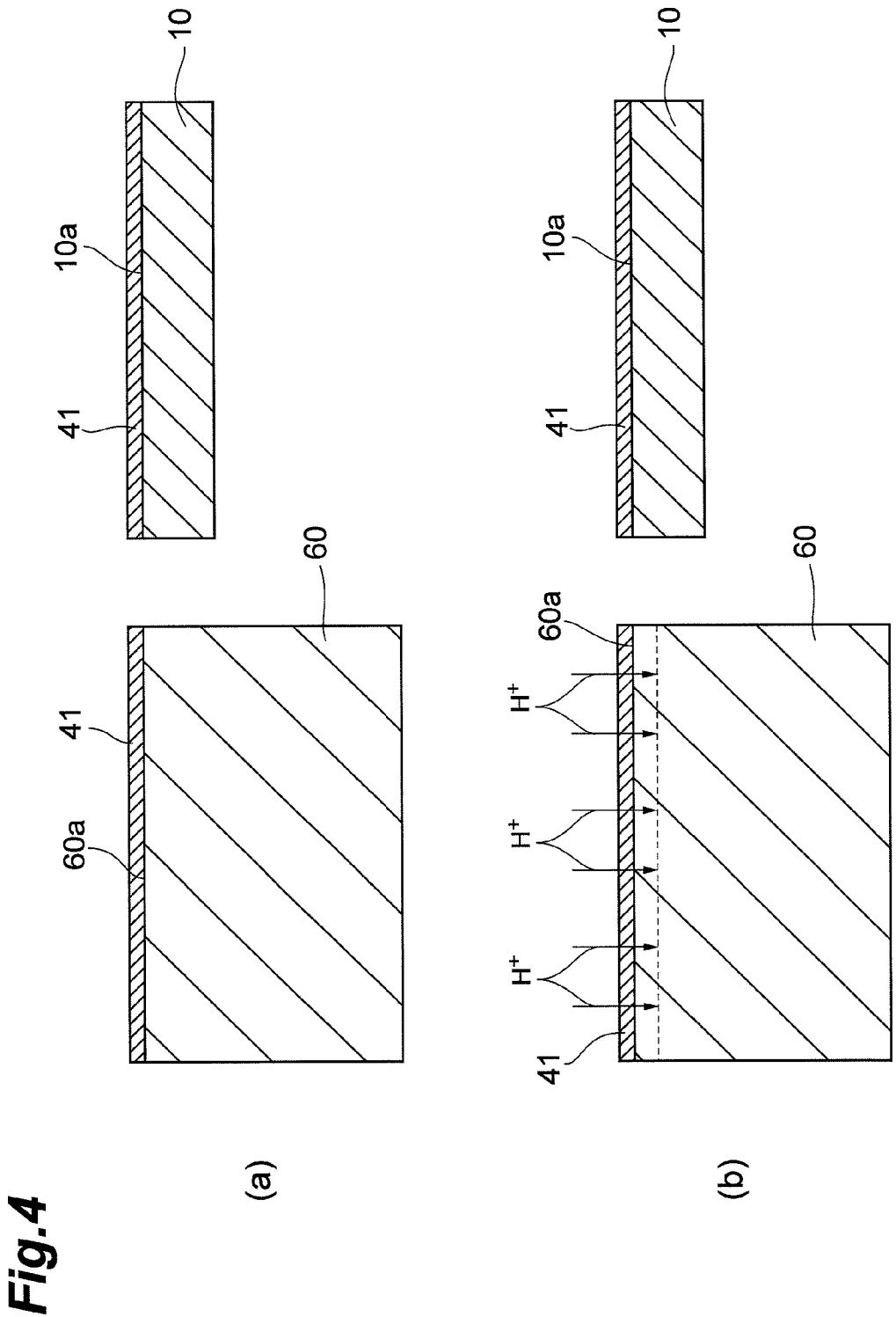
Figs. 4(a) and 4(b) (FIG. 4 Parts (a) and (b)) show cross-sectional views, each of which is taken along a line orthogonal to the direction of the waveguide of the semiconductor laser device, of the process steps of fabricating the semiconductor laser device in the Parts (a) and (b) thereof.

With reference to Part (a) of FIG. 4, a GaN substrate 10 and a GaN single crystal ingot 60 for forming a GaN thin film 40 are prepared. The primary surface 60a of the GaN single crystal ingot 60 has the above-described second orientation. A junction layer 41 is formed on the primary surface 10a of the GaN substrate 10 and the primary surface 60a of the GaN single crystal ingot 60 (junction layer formation step S1). The junction layer 41 is preferably composed of a material having electrical conductivity and providing high bonding strength, and such a material is as follow: ATO (antimony tin oxide), ZnO, $TiO_2$, strontium tin oxide (STO, $SrTiO_3$), $Ga_2O_3$, GZO (GA; ZnO, gallium-doped zinc oxide), $SnO_2$, $InO_3$, $SbO_3$, TiN, and so on.

As illustrated in Part (b) of FIG. 4, implantation of hydrogen ion $H^+$ is carried out through the junction layer 41 and the primary surface 60a into the GaN single crystal ingot 60 (ion implantation step S2). It is desirable to perform the implantation of hydrogen ion $H^+$ at the dosage and the energy level adjusted such that the peak of the hydrogen profile in the GaN single crystal ingot 60 is positioned at a predetermined depth from the primary surface 60a, e.g., a depth equivalent to a desired thickness of the GaN thin film 40. This step facilitates formation of the GaN thin film 40 by separation in a later step.

Figure 5:
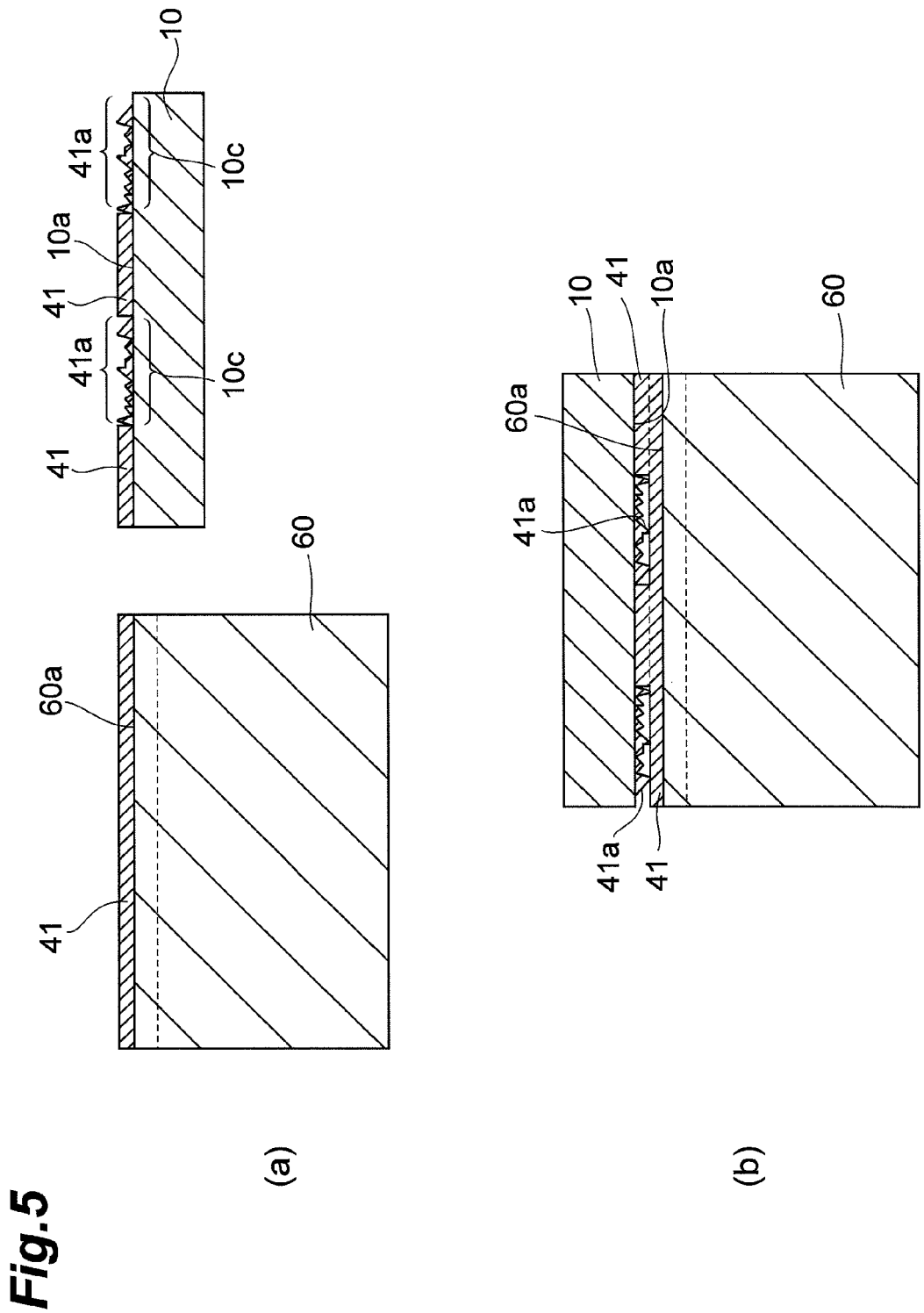
Figs. 5(a) and 5(b) (FIG. 5 Parts (a) and (b)) show cross-sectional views, each of which is taken along a line orthogonal to the direction of the waveguide of the semiconductor laser device, of process steps of fabricating the semiconductor laser device in the Parts (a) and (b) thereof.

As illustrated in Part (a) of FIG. 5, the junction layer 41 has portions and the other remaining portions, and these portions cover the first region 10c of the GaN substrate 10. The portions of the junction layer 41 that cover the first region 10c of the GaN substrate 10 are scratched to form non-junction regions 41a (non-junction region forming step S3), which has a surface roughness, incapable to form a junction. The roughness of the non-junction regions 41a is, for example, in the range of 200 nm to 1 µm. Instead of scratching, for example, removing the portions by etching that cover the first region 10c can be used in this step of forming the non-junction regions 41a. Scratching is advantageous in that it can be easily performed with tools, such as scribers. Etching is advantageous in that the depth and the width of the non-joining regions 41a can be easily controlled. Furthermore, etching can be performed using typical etching apparatuses. In Part (a) of FIG. 5, the non-junction regions 41a is formed only on the junction layer 41 stacked over the GaN substrate 10. Similar non-junction regions may also be formed on the junction layer 41 formed on the GaN single crystal ingot 60.

Subsequently, as illustrated in Part (b) of FIG. 5, the GaN substrate 10 and the GaN single crystal ingot 60 are arranged such that the primary surface 10a faces the primary surface 60a. Then, the junction layer 41 on the GaN substrate 10 and the junction layer 41 on the GaN single crystal ingot 60 are joined together (joining step S4). In this step, the surfaces of the junction layers 41 are activated by irradiation with plasma or ions before being joined together. Alternatively, the surfaces of these junction layers 41 may be put into contact with each other, and then the GaN substrate 10 and the GaN single crystal ingot 60 may be heated to a temperature in the range of 700 to 1000 degrees Celsius. Alternatively, metal films may be formed on the surfaces of the junction layers 41, and the metal films as formed may be put into contact with each other, and then the paired metal films may be heated to alloy therebetween. In the joining step, this step can form a strong junction, made of the junction layer 41 on the GaN substrate 10 and the junction layer 41 on the GaN single crystal ingot 60, in the region that the non-junction regions 41a is not provided.

Figure 6:
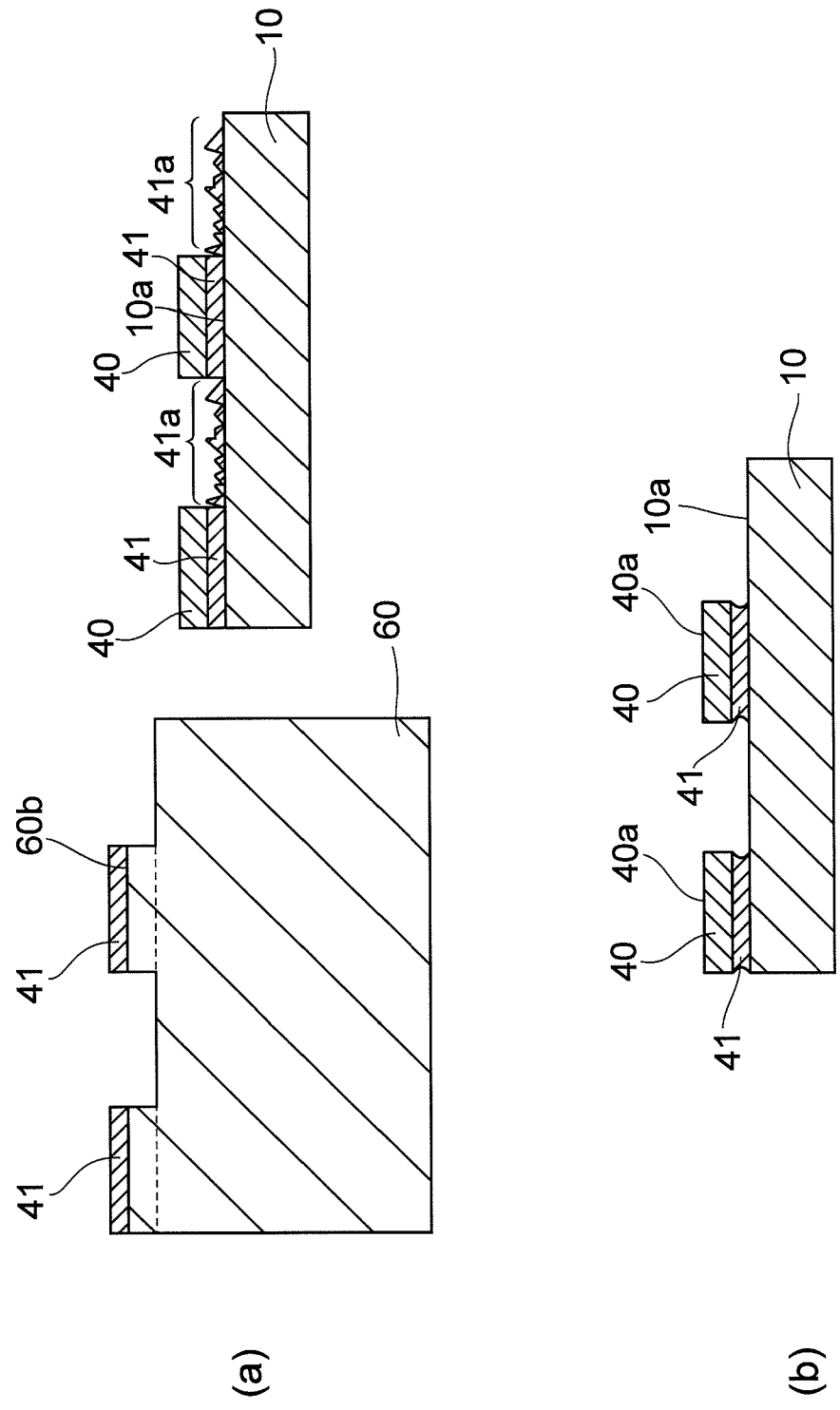
Figs. 6(a) and 6(b) (FIG. 6 Parts (a) and (b)) show cross-sectional views, taken along a plane orthogonal to the direction of the waveguide of the semiconductor laser device, of process steps of fabricating the semiconductor laser device in the Parts (a) and (b) thereof.

As illustrated in Part (a) of FIG. 6, the GaN substrate 10 is separated from the GaN single crystal ingot 60 (separation step S5). In the separation, part of the surface layer of the GaN single crystal ingot 60 is separated from the GaN single crystal ingot 60, i.e., to create the GaN thin film 40 by use of the junction layer 41 other than the non-junction regions 41a and leave it on the GaN substrate 10 in contact therewith. The thickness of the GaN thin film 40 is equivalent to the depth corresponding to the peak in the profile of the hydrogen ion implanted in the ion implantation step.

Subsequently, as illustrated in Part (b) of FIG. 6, the structures on the primary surface 10a of the GaN substrate 10 are etched (etching step S6). In this step, dry etching, for example, using $CF_4$ gas can be used. The step allows removal of the non-junction regions 41a of the junction layer 41 on the GaN substrate 10 to expose a part of the primary surface 10a of the GaN substrate 10, and the part that is exposed by the removal has a smoothened surface, thereby preparing the primary surface 10a for excellent crystal growth in a subsequent step. Together with obtaining this smoothness, the step can also form the smoothened surface of the GaN thin film 40, thereby preparing the surface 40a for excellent crystal growth in a subsequent step.

Figure 7:
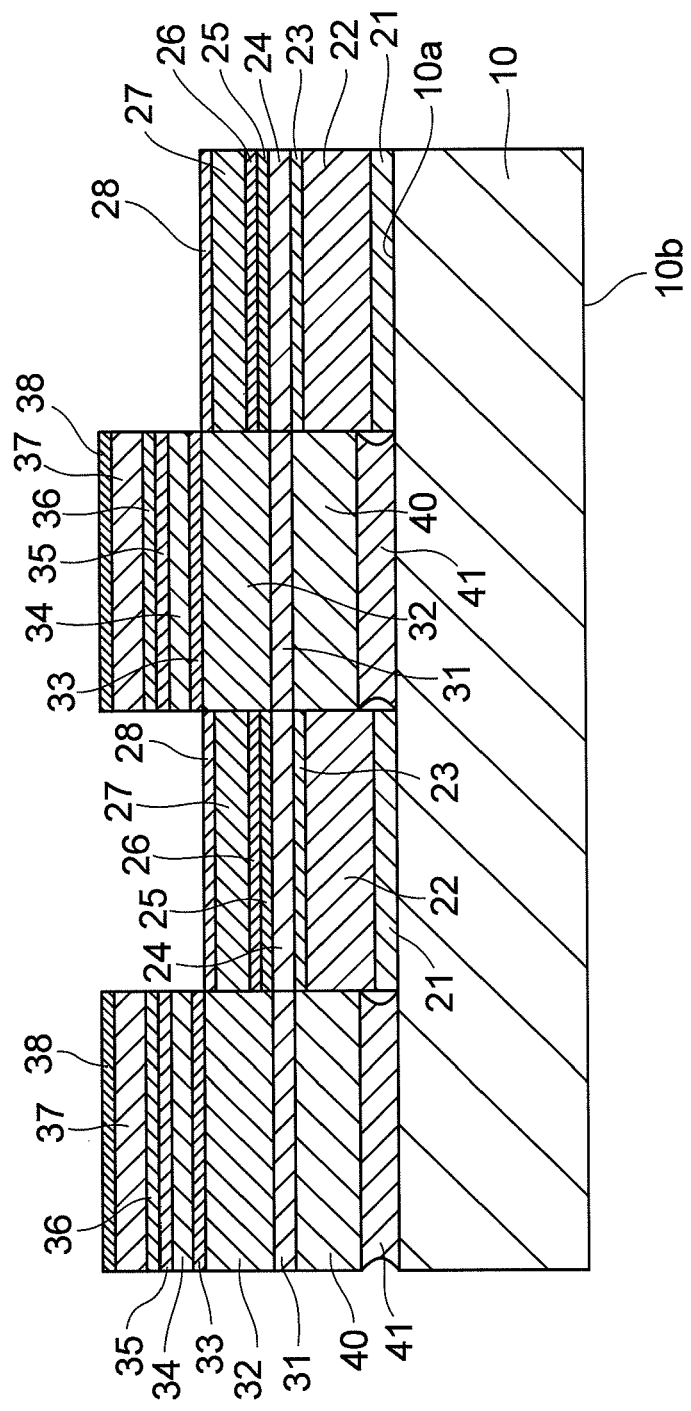
FIG. 7 is a cross-sectional view, taken along a plane orthogonal to the direction of the waveguide of the semiconductor laser device, showing a process step of fabricating the semiconductor laser device.

In the semiconductor-layer growing step S7, as illustrated in FIG. 7, semiconductor layers constituting a laser structure 20 (a buffer layer 21, a lower cladding layer 22, a lower optical guiding layer 23, an active layer 24, an upper optical guiding layer 25, an electron blocking layer 26, an upper cladding layer 27, and a contact layer 28) are grown on the first region 10c of the primary surface 10a of the GaN substrate 10, while semiconductor layers constituting a laser structure 30 (a buffer layer 31, a lower cladding layer 32, a lower optical guiding layer 33, an active layer 34, an upper optical guiding layer 35, an electron blocking layer 36, an upper cladding layer 37, and a contact layer 38) are grown on the surface 40a of the GaN thin film 40. These corresponding semiconductor layers are simultaneously grown on the GaN substrate 10 under the same growth conditions. For example, the well layers of the active layers 24 and 34 are simultaneously grown with the same raw material supplied to a growth reactor under growth conditions appropriate for the growth of these layers. This is also the same for the growth of the buffer layers 21 and 31, the growth of the lower cladding layers 22 and 32, the growth of the lower optical guiding layers 23 and 33, the growth of the upper optical guiding layers 25 and 35, the growth of the electron blocking layers 26 and 36, the growth of the upper cladding layers 27 and 37, and the growth of the contact layers 28 and 38. Through these steps, an epitaxial substrate is prepared. The primary surface 10a of the GaN substrate 10 includes first and second regions which are alternately arranged.

After the above-described steps, for example, the epitaxial substrate is subjected to the following processes to produce a substrate product: forming a ridge by etching; forming a cathode 52 (see FIG. 2) on the back surface 10b of the GaN substrate 10; and forming anodes 51 and 53 on the contact layers 28 and 38, respectively. In order to form end faces for cavity, the GaN substrate 10 is then cleaved in a direction orthogonal to the direction of the waveguide to form a bar, and the bar is cut into chips each containing a first region 10c and a second region 10d. This separation provides a semiconductor laser device 1A, which is illustrated in FIGS. 1 and 2.

The advantageous effects of the semiconductor laser device 1A according to this embodiment will be described. As described above, the semiconductor laser device 1A includes the GaN substrate 10 having the primary surface 10a, the normal vector of which largely tilts from the c-axis of the GaN crystal. But, the surface 40a has a slight off angle of approximately two degrees from the C plane of the GaN thin film 40. Thus, the surface 40a of the GaN thin film 40 virtually functions as the C plane of the GaN crystal. As described above, the orientation of the primary surface 10a of the GaN substrate 10 significantly differs from the orientation of the surface 40a of the GaN thin film 40 in this embodiment.

The laser structure 20 is grown on the primary surface 10a of the GaN substrate 10, and the laser structure 30 is grown on the surface 40a of the GaN thin film 40. In such a case, for example, even when the growth condition of the well layer of the active layer 24 in the laser structure 20 are the same as the growth condition of the well layer of the active layer 34 in the laser structure 30, these well layers can emit light having different wavelengths depending upon, for example, the In amount incorporated during the growth. Thus, in the semiconductor laser device 1A, the laser structures 20 and 30, having different emission wavelengths, can be readily formed on a single GaN substrate 10. Since the laser structures 20 and 30 are grown on the GaN substrate 10, the size of the semiconductor laser device 1A can be reduced compared with a structure including a number of light-emitting devices diebonded on a plate.

As described in this embodiment, it is preferable that the In content of the well layer of the active layer 24 be different from the In content of the well layer of the active layer 34. In the semiconductor laser device 1A according to this embodiment, the orientation of the primary surface 10a of the GaN substrate 10 significantly is different from the orientation of the surface 40a of the GaN thin film 40, facilitating the production of well layers having different In contents. This configuration enables the emission wavelength of the well layer of the active layer 24 to differ from the emission wavelength of the well layer of the active layer 34.

According to this embodiment, the orientation of the primary surface 10a of the GaN substrate 10 significantly differs from the orientation of the surface 40a of the GaN thin film 40, and the In content of the lower optical guiding layer 23 and the upper optical guiding layer 25 can be easily set to be different from the In content of the lower optical guiding layer 33 and the upper optical guiding layer 35.

Figure 8:
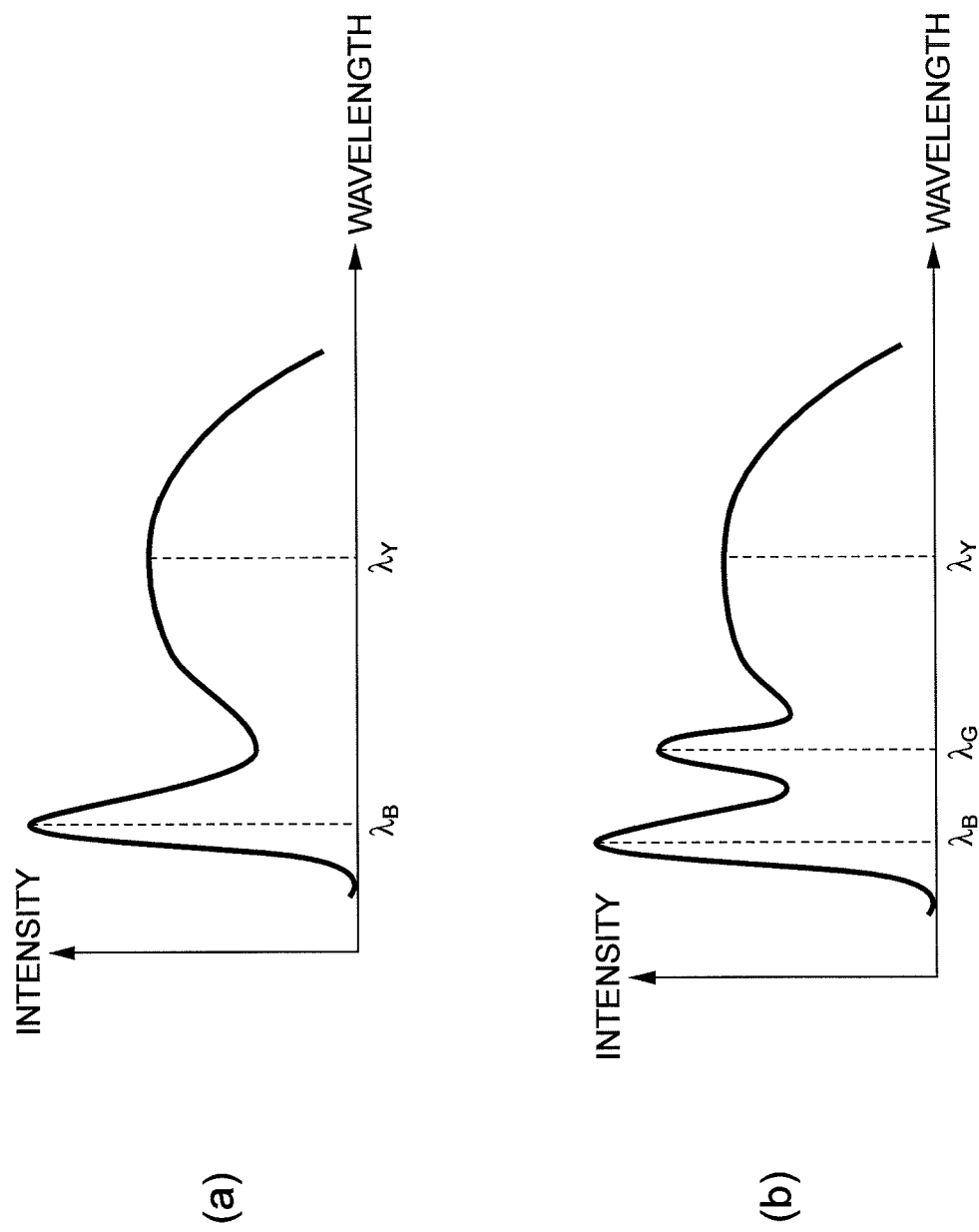
Figs. 8(a) and 8(b) (FIG. 8 Parts (a) and (b)) show graphs illustrating an advantage of emission of green light and blue light from a single semiconductor light-emitting device in Parts (a) and (b).

As described in this embodiment, it is preferable that the emission wavelength of one of the two active layers, e.g., the well layer of the active layer 24, be in the range of 500 to 550 nm (green wavelength band) and that the emission wavelength of the well layer of the other active layer 34 be in the range of 430 to 480 nm (blue wavelength band). Parts (a) and (b) of FIG. 8 are graphs illustrating an advantage of emission of green light and blue light from a single semiconductor light-emitting device. Part (a) of FIG. 8 illustrates an exemplary spectrum of a conventional semiconductor light-emitting device which generates mixed light from blue light and yellow light emitted from a fluorescent substance excited by part of the blue light. In the graph, symbol $\lambda_B$ indicates the peak wavelength of the blue light, and symbol $\lambda_y$ indicates the peak wavelength of the yellow light. Part (b) of FIG. 8 illustrates an exemplary spectrum of mixed light of blue light, green light, and yellow light emitted from a fluorescent substance excited by part of the blue light. In the graph, symbol $\lambda_G$ indicates the peak wavelength of the green light. An object irradiated with light having the spectrum illustrated in Part (a) of FIG. 8 looks bluish. As compared to this, an object irradiated with light having the spectrum illustrated in Part (b) of FIG. 8 looks natural in color. This shows that color rendering properties are improved by emission of green light and blue light from a single semiconductor light emitting device.

As described in this embodiment, it is preferable that the primary surface 10a of the GaN substrate 10 have a semipolar plane or non-polar plane of the GaN crystal. These orientation planes allow the well layer of the active layer 24 to have large In content, thereby achieving emission of light in a green wavelength band of the range of 500 to 550 nm.

As described in this embodiment, preferably the junction layer 41 is composed of a conductive material. The junction layer 41 of a conductive material allows the produced semiconductor laser device 1A to have the cathode 52 disposed on the back surface 10b of the GaN substrate 10. The junction layer 41 may have insulation properties. In such a case, for example, the laser structure 30 is partly etched to expose the lower cladding layer 32, and a cathode is formed on the exposed lower cladding layer 32. A material suitable for the insulating junction layer 41 is, for example, silicon oxides (for example, $SiO_2$), which have tolerance to a high-temperature ammonia atmosphere in growing the semiconductor layers.

Figure 9:
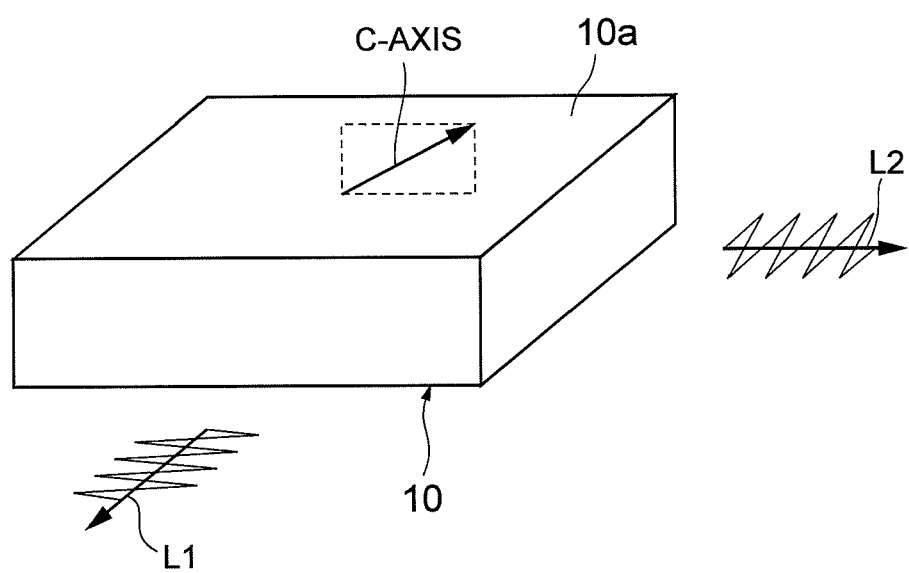
FIG. 9 illustrates a polarized optical component in a direction parallel to the inclination direction of the primary surface of the substrate and a polarized optical component in a direction orthogonal to the inclination direction of the primary surface of the substrate.

In this embodiment as described above, the longitudinal direction of the optical waveguide structure of the laser structure 20 is determined by the strip of the anode 51. The longitudinal direction is orthogonal to the c-axis of the GaN substrate 10, which tilts from the normal vector of the primary surface 10a of the GaN substrate 10, i.e., orthogonal to a reference plane defined by the normal vector and the c-axis. In this example, a cleavage faces (A plane) can be used as a cavity end face of the optical waveguide of the laser structure 20, regardless of the tilt angle of the c-axis. However, the positional relationship between the longitudinal direction of the optical waveguide structure and the tilt direction of the c-axis may be changed, if necessary. For example, the longitudinal direction of the optical waveguide structure of the laser structure 20 may tilt toward the c-axis (preferably, parallel to the c-axis). In this example, the plane orientation that is effective in end faces for optical cavity for green lasing (for example, the (−1017) plane) can be utilized as cavity end faces of the laser structure 20. In one example, the laser light emitted from the laser structure 20 as described in this embodiment, which is provided on the GaN substrate 10 having the primary surface 10a tilting toward the m-axis, has positive polarization. Thus, as illustrated in FIG. 9, in the laser light having an optical component L1 indicating a polarization direction parallel to the tilt direction of the primary surface 10a and an optical component L2 indicting a polarization direction orthogonal to the tilt direction of the primary surface 10a, the intensity of the optical component L1 is smaller than the intensity of the optical component L2. The TE mode contributes to lasing. Thus, the lasing efficiency can be enhanced by setting the longitudinal direction of the optical waveguide structure such that the direction of the TE mode corresponds to the direction in which the polarization direction is orthogonal to the inclination direction of the primary surface 10a. Preferably the longitudinal direction of such an optical waveguide structure is parallel to a plane defined by the tilt direction of the c-axis and the normal axis of the primary surface. In such a case, a sufficiently large thickness of the GaN substrate 10 can reduce creation of slip plane defects on the cavity end face of the laser structure 20

For example, in an embodiment of the primary surface 10a of the GaN substrate 10 having a C plane (or has a slight off angle to the C plane), preferably, the longitudinal direction of the optical waveguide structure of the laser structure 30 extends in the direction of the axis that is defined as the c-axis projected onto the primary surface 10a (the tilt direction of the c-axis) or, more preferably, extends parallel to the tilt direction of the c-axis. In this example, the plane that is effective in end faces for optical cavity for green lasing (for example, the (−1017) plane) can be utilized as cavity end faces of the laser structure 30. Because of the GaN substrate 10 of the primary surface 10a comprising the C plane, when the GaN substrate 10 is cleaved along a cleavage face such as the M plane, end faces for optical cavity of the laser structure 30 can be provided with fractured faces created in association with the cleavage, resulting in preparing excellent cavity end faces.

(Modified Embodiment)

Figure 10:
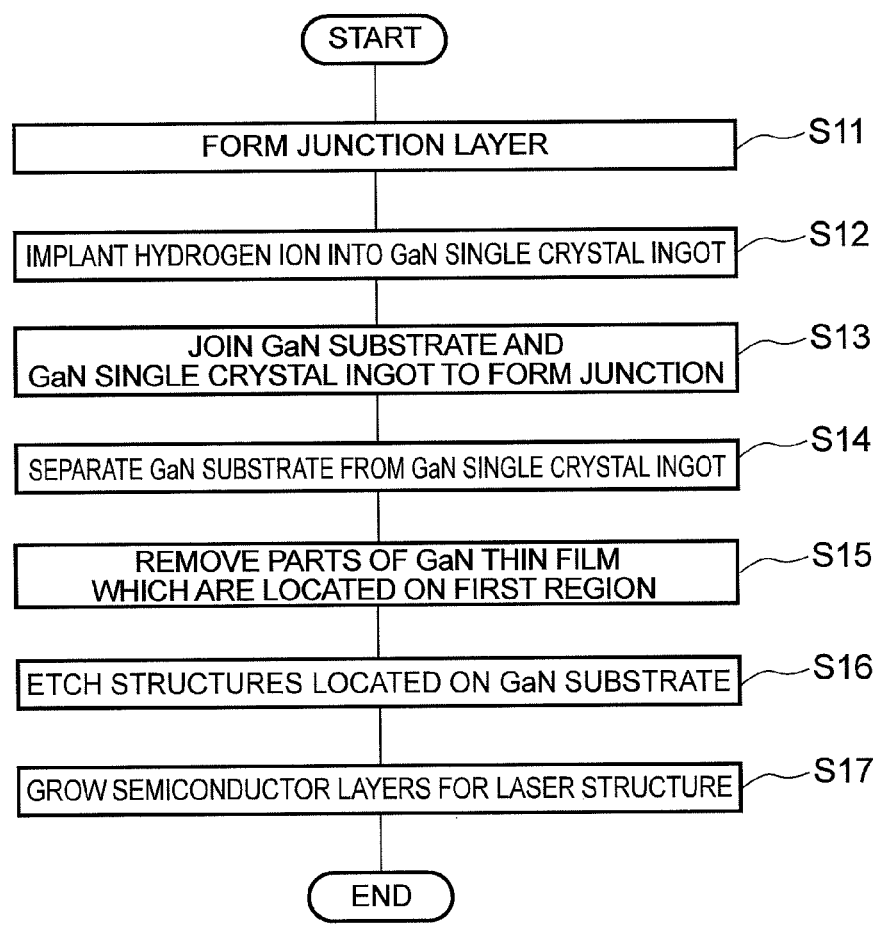
FIG. 10 is a flow chart illustrating a method of fabricating the semiconductor laser device according to a modified embodiment.
Figure 11:
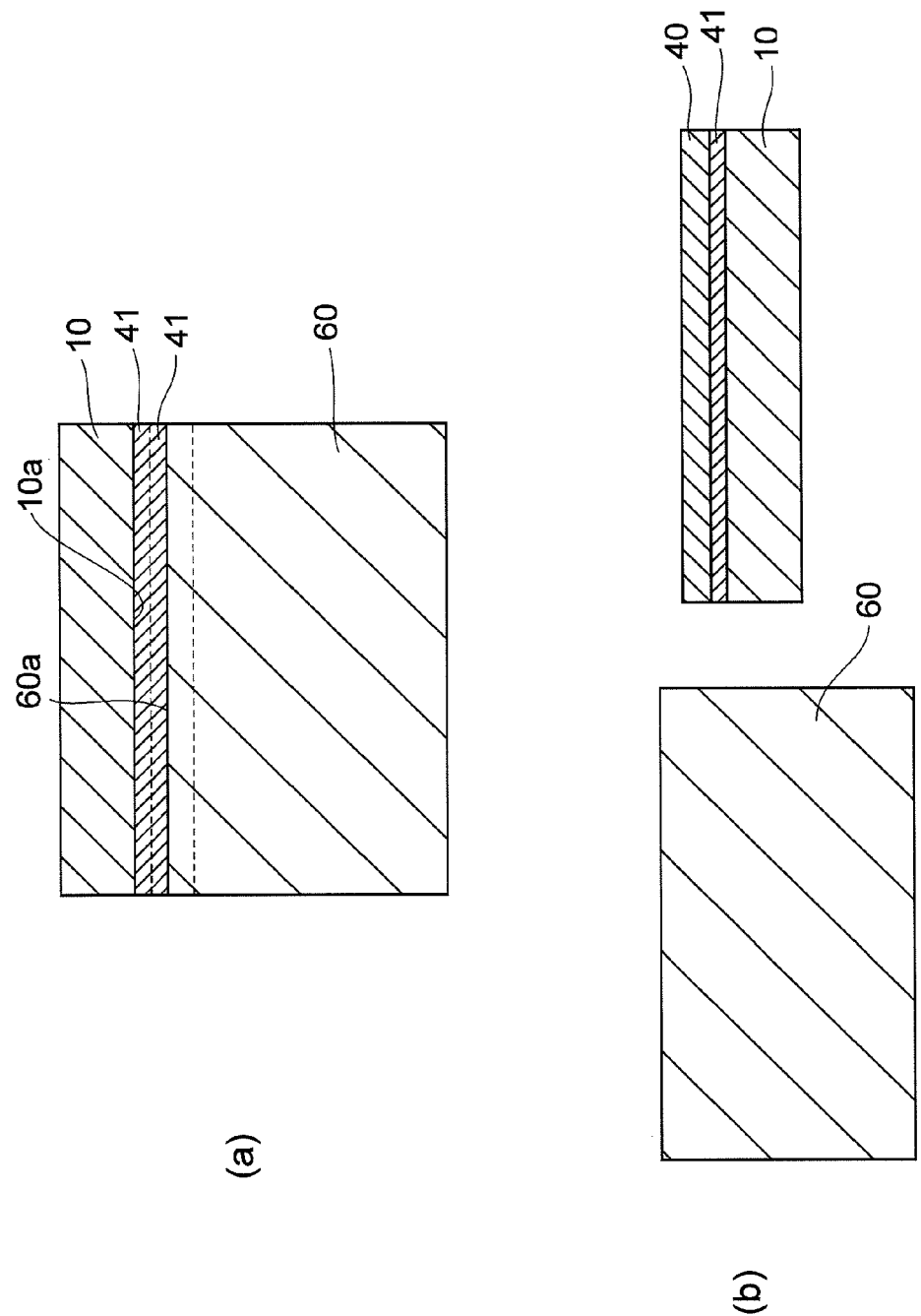
Figs. 11(a) and 11(b) (FIG. 11 Parts (a) and (b)) show cross-sectional views, each of which is taken along a line orthogonal to the direction of the waveguide of the semiconductor laser device, of the process of fabricating the semiconductor laser device according to the modified embodiment in Parts (a) and (b).
Figure 12:
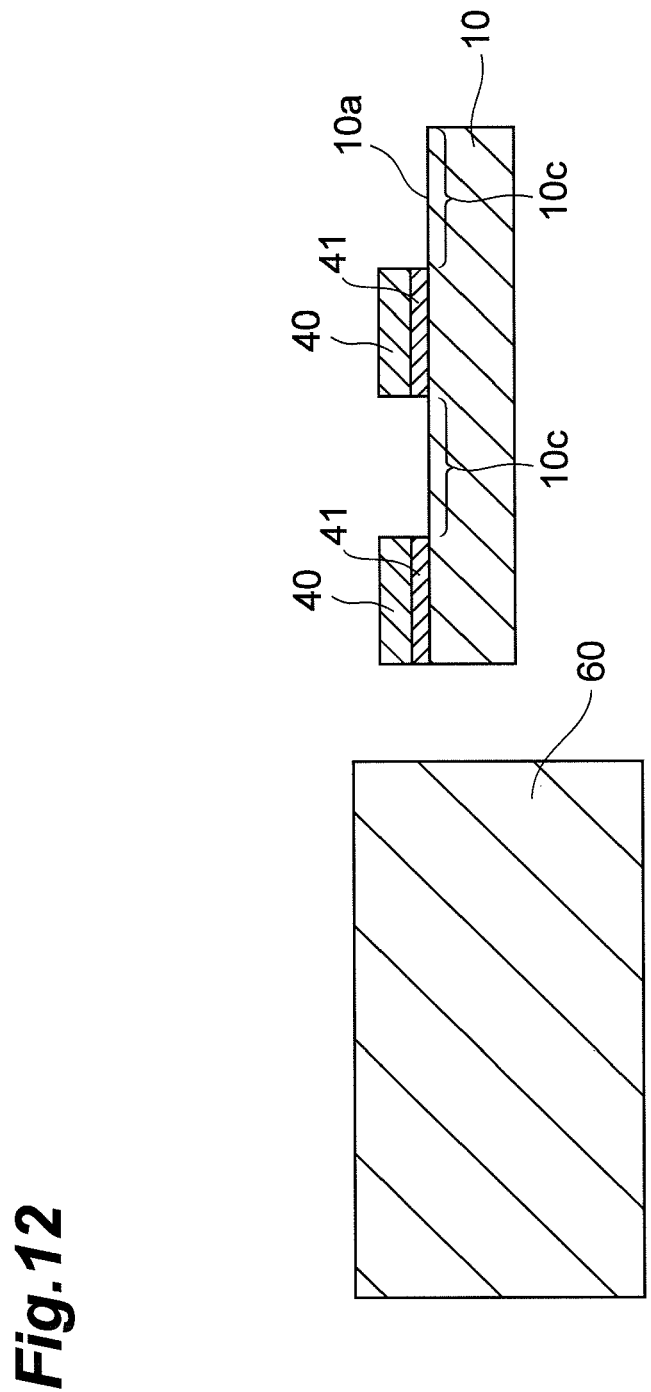
FIG. 12 is a cross-sectional view, taken along a plane orthogonal to the direction of the waveguide of the semiconductor laser device, of the process of fabricating the semiconductor laser device according to the modified embodiment.

Another process of fabricating the semiconductor laser device 1A according to a modified embodiment of the first embodiment will be described below. FIG. 10 is a flow chart illustrating a process of fabricating the semiconductor laser device 1A according to this modified embodiment. FIGS. 11 and 12 shows cross-sectional views, each of which is taken along a plane orthogonal to the direction of the waveguide of the semiconductor laser device 1A, in the method of fabricating the semiconductor device according to this modified embodiment.

As in the first embodiment, a GaN substrate 10 and a GaN single crystal ingot 60 for providing a GaN thin film 40 are prepared; a junction layers 41 are formed on the primary surface 10a of the GaN substrate 10 and the primary surface 60a of the GaN single crystal ingot 60, respectively (junction layer formation step S11; see Part (a) of FIG. 4). Then, ion implantation of hydrogen ions $H^+$ is carried out through the junction layer 4 into the primary surface 60a of the GaN single crystal ingot 60 (ion implantation step S12; see Part (b) of FIG. 4).

Subsequently, as illustrated in Part (a) of FIG. 11, the GaN substrate 10 and the GaN single crystal ingot 60 are arranged such that the primary surface 10a faces the primary surface 60a. Then, the junction layer 41 on the GaN substrate 10 and the junction layer 41 on the GaN single crystal ingot 60 are joined together (joining step S13) to form a junction therebetween. Various processes of joining the junction layers 41 together can be used in this joining step, similar to the first embodiment.

As illustrated in Part (b) of FIG. 11, the GaN substrate 10 and the GaN single crystal ingot 60 are separated from each other (separation step S14). In the separation, part of the surface layer of the GaN single crystal ingot 60, i.e., the GaN thin film 40 is peeled from the GaN single crystal ingot 60 together with the GaN substrate 10 and is left on the junction layer 41 of the GaN substrate 10. The thickness of the GaN thin film 40 is substantially equal to the depth of the peak of the hydrogen profile of the hydrogen ions implanted in the ion implantation step. The implant energy and dosage level of the hydrogen ions during ion implantation can be adjusted such that the position (depth) of the peak level of the hydrogen profile matches the predetermined thickness of the GaN thin film 40. The predetermined thickness of the GaN thin film 40 is, for example, in the range of 50 to 500 nm.

As illustrated in FIG. 12, a part of the GaN thin film 40, i.e., a part located on the first region 10c of the GaN substrate 10, is removed (removal step S15). In this step, the part of the GaN thin film 40 is preferably removed by etching, e.g., reactive ion etching (RIE) using $Cl_2$.

Subsequently, the structures on the primary surface 10a of the GaN substrate 10 are etched (etching step S16; see Part (b) of FIG. 6). In this step, for example, dry etching using $CF_4$ gas can be used. The step allows the removal of the part of the junction layer 41 that is located above first region 10c, thereby exposing a part of the primary surface 10a of the GaN substrate 10, and the primary surface 10a exposed by the removal can be made smooth so as to provide the primary surface 10a for excellent crystal growth in a subsequent step. At the same time, the surface 40a of the GaN thin film 40 is also made smooth so as to provide the surface 40a for excellent crystal growth in a subsequent step.

In the semiconductor-layer growing step S17, semiconductor layers constituting a laser structure 20 are grown on the first region 10c of the primary surface 10a of the GaN substrate 10, and semiconductor layers constituting a laser structure 30 are also grown on the surface 40a of the GaN thin film 40 (see FIG. 7). A cathode 52 (see FIG. 2) is formed on the back surface 10b of the GaN substrate 10, and anodes 51 and 53 are formed on the contact layers 28 and 38, respectively. In order to form end faces for optical cavity, the GaN substrate 10 is cleaved in a direction orthogonal to the direction of the waveguide to form a bar. Then, the bar is cut at intervals corresponding to the sum of the width of a first region 10c and the width of a second region 10d. This separation produces a semiconductor laser device 1A.

(Second Embodiment)

Figure 13:
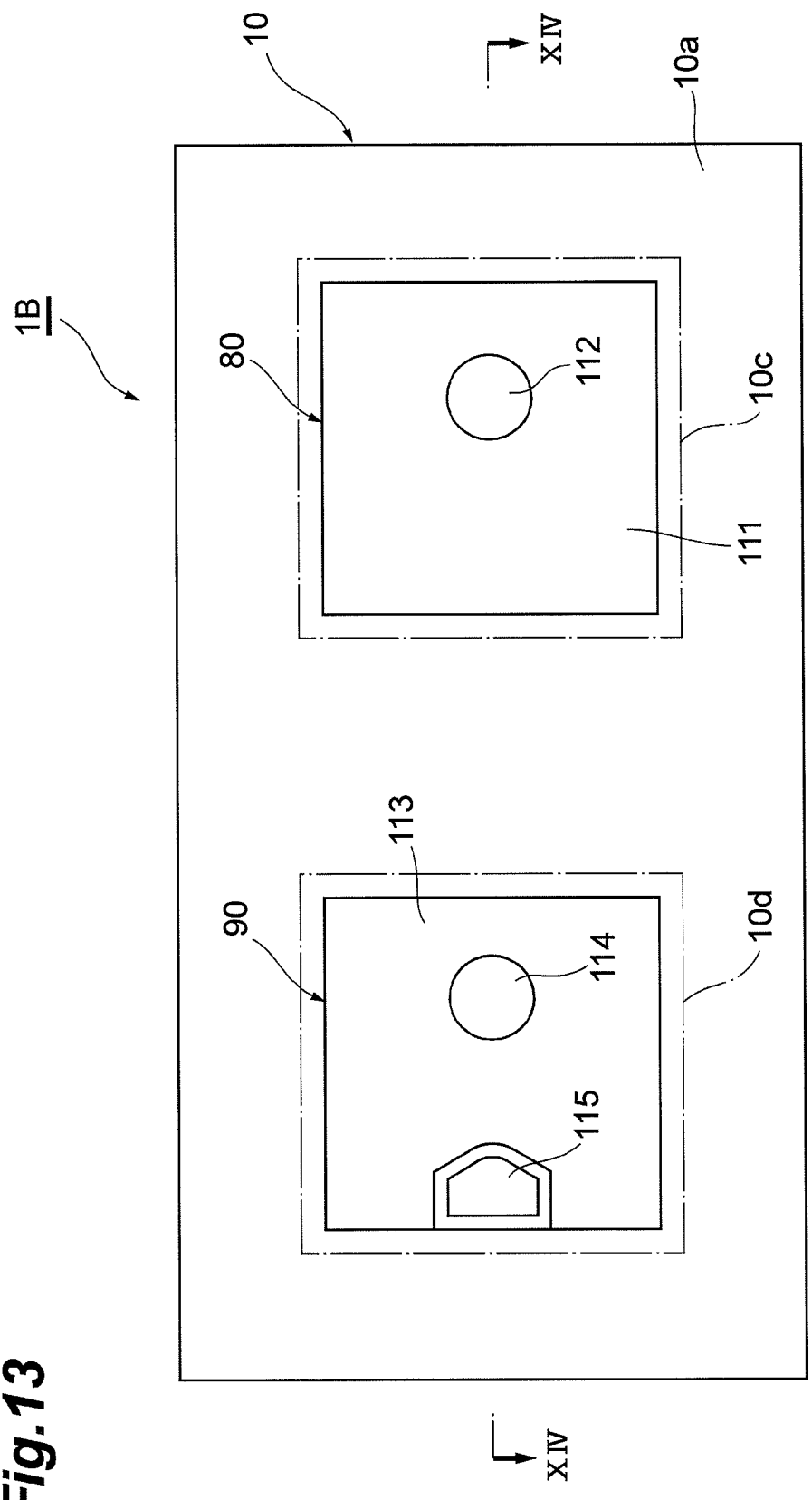
FIG. 13 is a plan view of a light-emitting diode (LED) shown as an example of a semiconductor optical device according to a second embodiment.
Figure 14:
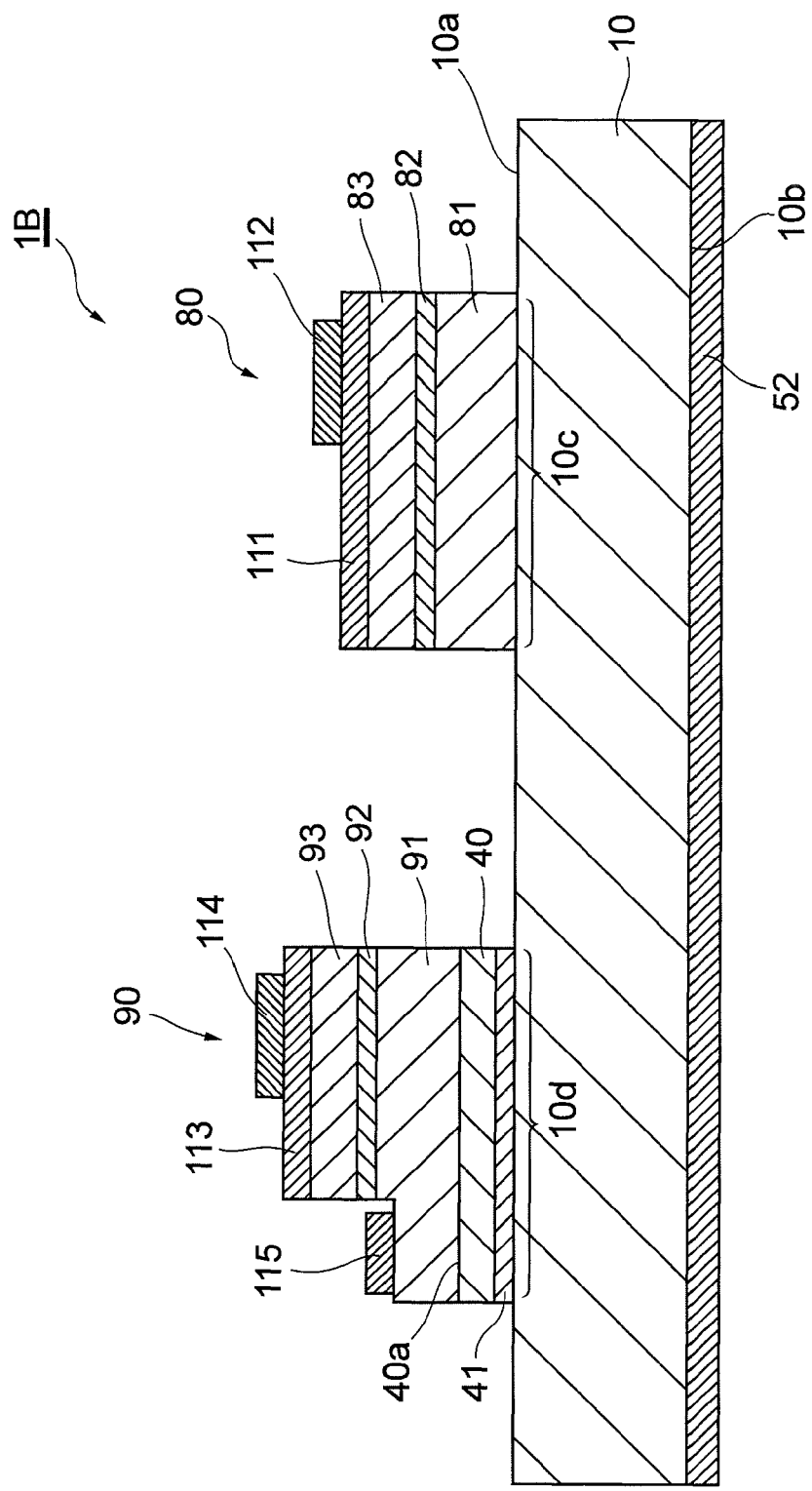
FIG. 14 is a cross-sectional view of the LED taken along line XIV-XIV in FIG. 13.

A semiconductor optical device according to the second embodiment of the present invention will be described below. FIG. 13 is a plan view of a light-emitting diode (LED) 1B, which is shown as the semiconductor optical device according to this embodiment. FIG. 14 is a cross-sectional view of the LED 1B taken along line XIV-XIV in FIG. 13. As illustrated in FIGS. 13 and 14, the LED 1B according to this embodiment includes a GaN substrate 10, which is used as a group III nitride semiconductor substrate, an LED structure 80, which is use as a first group III nitride semiconductor laminate, an LED structure 90, which is use as a second group III nitride semiconductor laminate, and a GaN thin film 40, which is used as a group III nitride semiconductor thin film. The configuration of the GaN substrate 10 may be the same as that according to the first embodiment.

The LED structure 80 includes a light-emitting diode structure and is formed by crystal growth method on a first region 10c in a primary surface 10a. The LED structure 80 according to this embodiment includes a lower cladding layer 81, an active layer 82, and an upper cladding layer 83, and these layers are grown over the primary surface 10a in this order. The lower cladding layer 81 is in contact with the primary surface 10a and is composed of, for example, n-type GaN. The lower cladding layer 81 has a thickness of, for example, 1.5 µm. The upper cladding layer 83 is provided on the lower cladding layer 81 and is composed of, for example, p-type GaN. The upper cladding layer 83 has a thickness of, for example, 400 nm.

The active layer 82 corresponds to a first active layer according to this embodiment. The active layer 82 is provided between the lower cladding layer 81 and the upper cladding layer 83. The active layer 82 may have a quantum well structure. If required, the quantum well structure may include well layers (first well layers) and barrier layers which are alternately arranged. The well layer may be composed of a group III-V compound semiconductor containing In, such as InGaN. The barrier layer may be composed of a group III-V compound semiconductor, such as InGaN or GaN, having a band gap energy greater than that of the well layer. In this embodiment, the well layer (for example, InGaN) has a thickness of, for example, 3 nm, and the barrier layer (for example, GaN) has a thickness of, for example, 15 nm. The emission wavelength of the active layer 82 can be adjusted by the band gap, In content, thickness, and other qualities of the well layer. The active layer 82 may have an In composition that enables the generation of green light having a peak wavelength within the range of 500 to 550 nm. The composition of the well layer is, for example, $In_{0.3}Ga_{0.7}N$.

An anode 111 and an electrode pad 112 are disposed on the upper cladding layer 83. The anode 111 in this embodiment covers the entire surface of the upper cladding layer 83. The anode 111 is composed of, for example, a Ni/Au film and is in ohmic contact with the upper cladding layer 83.

The GaN thin film 40 in this embodiment is different from that in the first embodiment and is composed of undoped GaN single crystal. The GaN thin film 40 is provided on the primary surface 10a of the GaN substrate 10 and is joined together with a second region 10d, which is different from the first region 10c, using a junction layer 41 provided therebetween. The junction layer 41 is interposed between the second region 10d and the GaN thin film 40 and is in contact with both the second region 10d and the junction layer 41. Such a GaN thin film 40 is produced through a process similar to that according to the first embodiment. The GaN thin film 40 has a surface 40a that has the same orientation as that of the first embodiment.

The LED structure 90 includes a light emitting diode structure and is formed by crystal growth method on the GaN thin film 40. The LED structure 90 according to this embodiment includes a lower cladding layer 91, an active layer 92, and an upper cladding layer 93, and these layers are grown on the surface 10a in this order. The lower cladding layer 91 is in contact with the surface 40a and is composed of, for example, n-type GaN. The lower cladding layer 91 has a thickness of, for example, 1.5 µm. The upper cladding layer 93 is provided on the lower cladding layer 91 and is composed of, for example, p-type GaN. The upper cladding layer 93 has a thickness of, for example, 400 nm.

The active layer 92 corresponds to a second active layer according to this embodiment. The active layer 92 is sandwiched between the lower cladding layer 91 and the upper cladding layer 93. The In content of the well layer of the active layer 92 is different from, for example, the well layer of the active layer 82. The structure of the active layer 92 is the same as the structure of the above-described active layer 82, except for its In content. The In composition of the well layer (second well layer) of the active layer 92 is different from the In composition of the well layer of the active layer 24; the composition of the well layer of the active layer 92 is, for example, $In_{0.2}Ga_{0.8}N$. Such difference in the In composition of the well layers is caused by a difference in the orientation between the primary surface 10a of the GaN substrate 10 and the surface 40a of the GaN thin film 40. In this embodiment, the difference in the In composition of the well layers allows the wavelength of the light emitted from the well layer of the active layer 82 to be different from the light emitted from the well layer of the active layer 92. As described above, the well layer of the active layer 82 emits, for example, green light having a peak wavelength in the range of 500 to 550 nm. The well layer of the active layer 92 emits, for example, blue light having a peak wavelength in the range of 490 to 480 nm.

An anode 113 and an electrode pad 114 are disposed on the upper cladding layer 93. The anode 113 in this embodiment covers the entire surface of the upper cladding layer 93. The anode 113 is composed of, for example, a Ni/Au film and is in ohmic contact with the upper cladding layer 93.

The active layer 92 and the upper cladding layer 93 have portions, respectively, which are located on a part of the surface 40a of the GaN thin film 40, and these portions are removed by etching so as to expose the lower cladding layer 91 on this part of the surface 40a. A cathode 115 is disposed on the exposed portion of the lower cladding layer 91. The cathode 115 is composed of, for example, a Ti/Al film and is in ohmic contact with the lower cladding layer 91.

Figure 15:
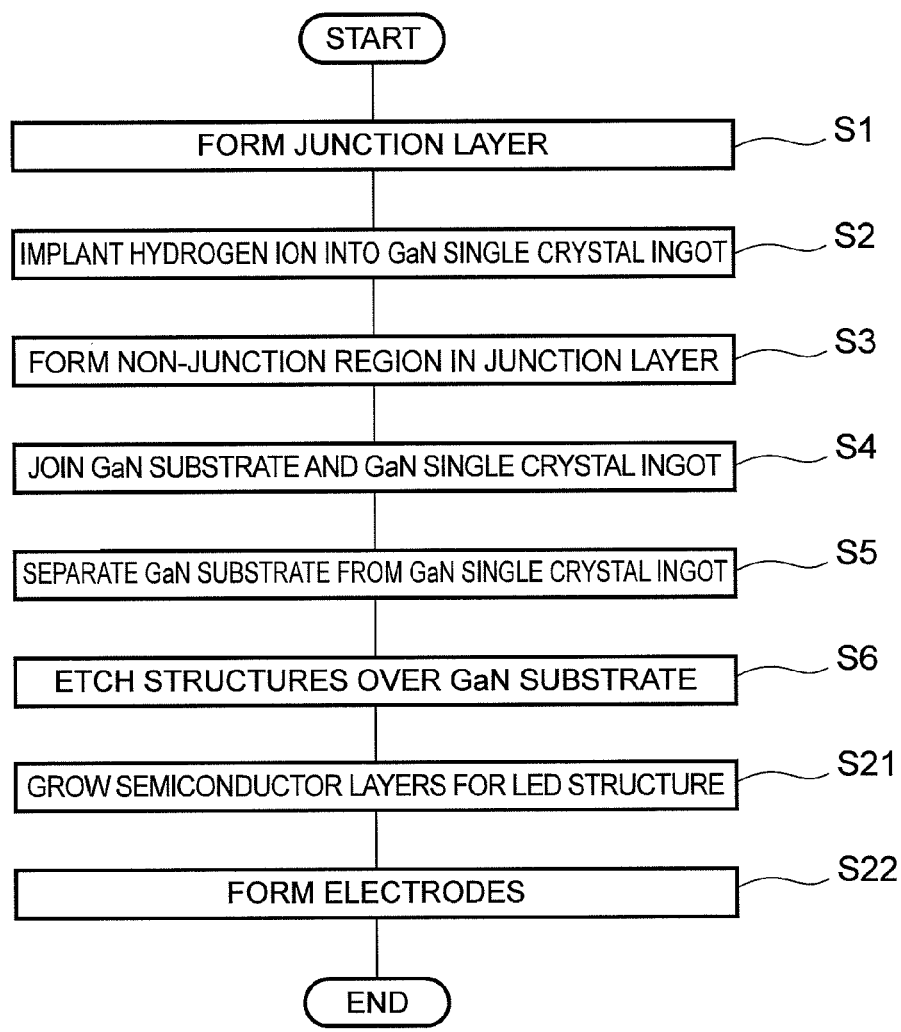
FIG. 15 shows a flow chart illustrating a process step of fabricating the LED.
Figure 16:
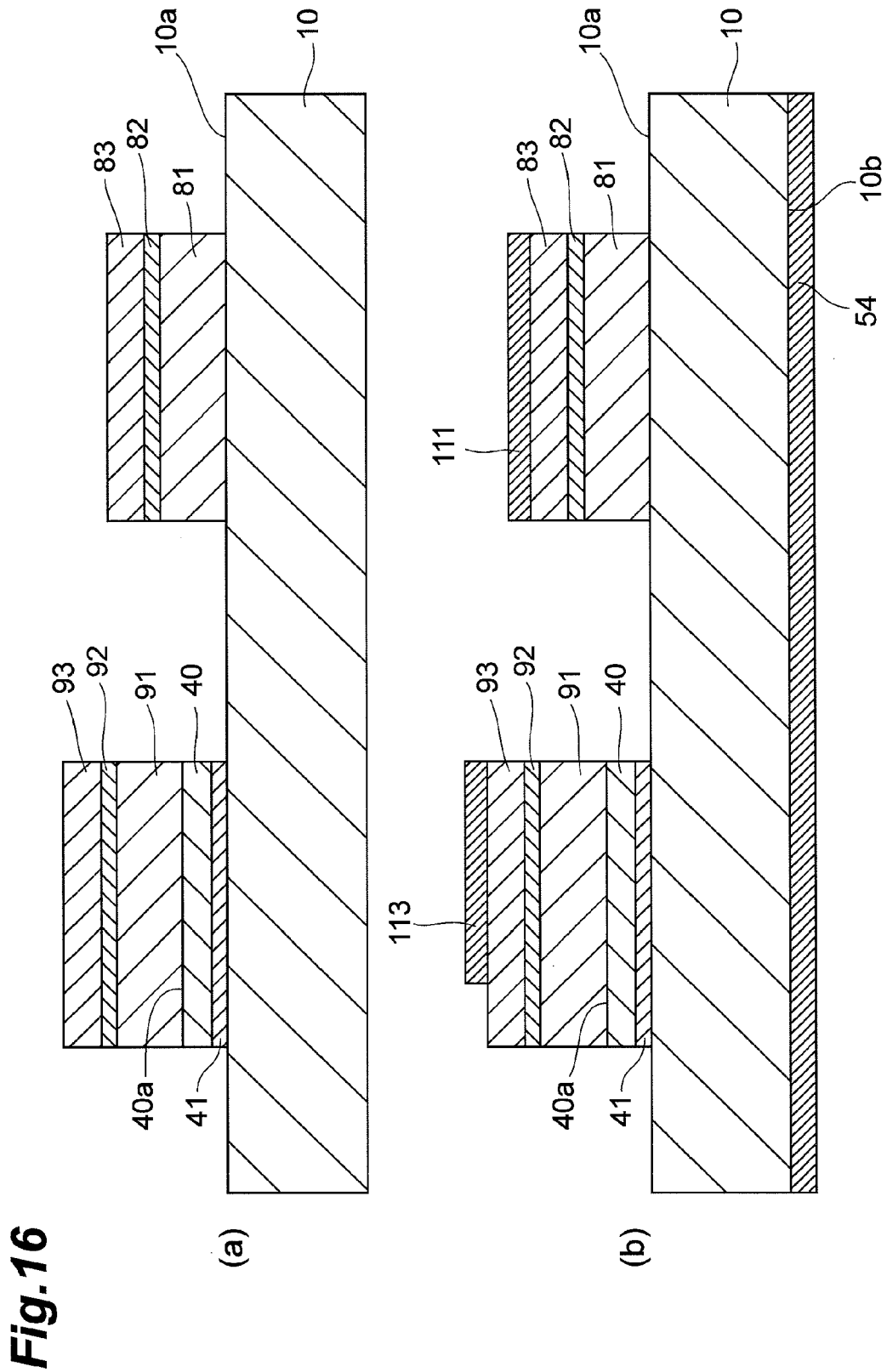
Figs. 16(a) and 16(b) (FIG. 16 Parts (a) and (b)) show cross-sectional views of process steps of fabricating the LED in Parts (a) and (b) thereof.
Figure 17:
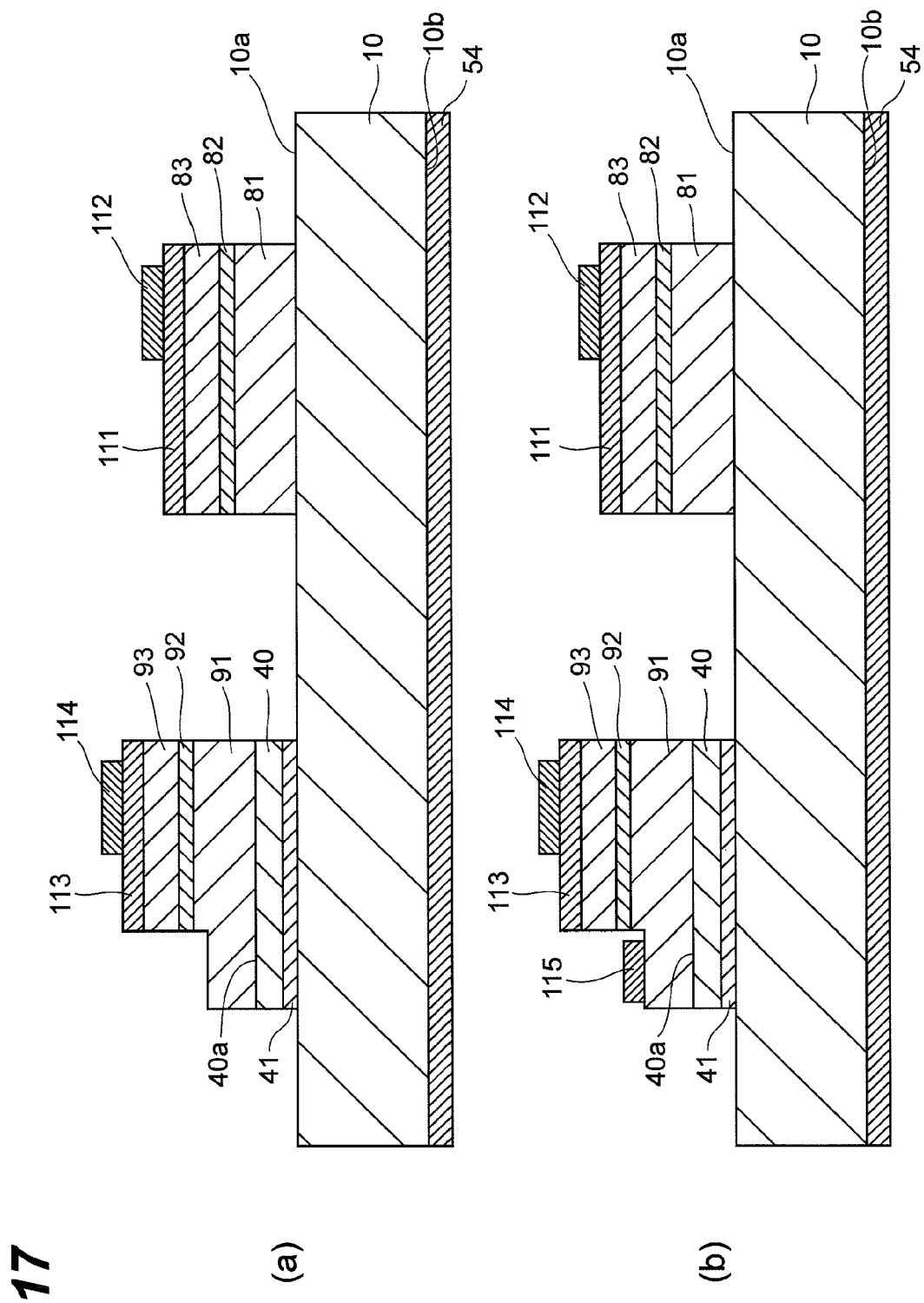
Figs. 17(a) and 17(b) (FIG. 17 Parts (a) and (b)) show cross-sectional views of process steps of fabricating the LED in steps in Parts (a) and (b) thereof.

The LED 1B, which has the above-described configuration, is fabricated using a fabricating process as described below, for example. FIG. 15 is a flow chart illustrating a process of fabricating the LED 1B. Parts (a) and (b) of FIGS. 16 and 17 show cross-sectional views of the LED 1B in fabricating steps.

As with the case of the first embodiment, the following steps are carried out (see FIGS. 4 to 6): junction-layer formation step S1, ion implantation step S2, non-junction region forming step S3, joining step S4, separation step S5, and etching step S6. The junction layer 41 according to this embodiment is preferably composed of an insulating material (for example, $SiO_2$). In the semiconductor-layer growing step S21, as illustrated in Part (a) of FIG. 16, semiconductor layers constituting an LED structure 80 (specifically, a lower cladding layer 81, an active layer 82, and an upper cladding layer 83, which are illustrated in FIG. 14) are grown on the first region 10c of the primary surface 10a of the GaN substrate 10, while semiconductor layers constituting an LED structure 90 (specifically, a lower cladding layer 91, an active layer 92, and an upper cladding layer 93, which are illustrated in FIG. 14) are grown on the surface 40a of the GaN thin film 40. These corresponding semiconductor layers are simultaneously grown on the GaN substrate 10 under the same growth condition. For example, the well layers of the active layers 82 and 92 are simultaneously grown with the same material supplied to a growth reactor under growth condition appropriate for the growth of these layers. The growth of the lower cladding layers 81 and 91 and the upper cladding layer 83 and 93 may be also the same as the growth of the upper cladding layers 82 and 92.

After completing the above-described steps, the electrodes are formed on the LED 1B (electrode formation step S22). As illustrated in Part (b) of FIG. 16, the cathode 52 is formed on the back surface 10b of the GaN substrate 10, and the anodes 111 and 113 are formed on the upper cladding layers 83 and 93, respectively. As illustrated in Part (a) of FIG. 17, part of the LED structure 90 is etched to expose the lower cladding layer 91, and the cathode 115 is formed on the exposed surface of the lower cladding layer 91 (see Part (b) of FIG. 17). Finally, forming the electrode pads 112 and 114 on the anodes 111 and 113, respectively, results in the LED 1B, which is illustrated in FIGS. 13 and 14.

As in the semiconductor laser device 1A according to the first embodiment, the orientation of the primary surface 10a of the GaN substrate 10 is significantly different from the orientation of the surface 40a of the GaN thin film 40 in the LED 1B according to this embodiment. Thus, the wavelength of light emitted from the well layer of the active layer 82 in the LED structure 80 is different from the wavelength of light emitted from the well layer of the active layer 92 in the LED structure 90. Hence, in the LED 1B, the emission wavelength of the LED structure 80 is different from the emission wavelength of the LED structure 90. The LED structures 80 and 90 can be easily produced on a single GaN substrate 10. Since the LED structures 80 and 90 are grown on the GaN substrate 10, the size of the light-emitting device can be reduced compared with the size of a structure including light-emitting devices disposed on a plate.

In this embodiment, it is preferable that the primary surface 10a tilt toward the m axis away from the c-axis of the GaN substrate 10 and that the surface 40a tilt toward the a-axis with respect to the c-axis of the GaN thin film 40. In a preferable embodiment, the primary surface 10a tilts in the m axis direction from the c-axis of the GaN substrate 10 at an angle of 75 degrees, and the surface 40a tilts in the a-axis direction with respect to the c-axis of the GaN thin film 40 at an angle of 18 degrees. By electing the tilt directions of the primary surface 10a and the surface 40a with respect to the c-axis, the polarization direction of light emitted from the LED structure 80 matches the polarization direction of light emitted from the LED structure 90, whereby a light emitting diode that is suitable for the application of liquid-crystal displays can be produced. The tilt directions of the primary surface 10a and the surface 40a from the c-axis are not limited to the above-described direction and may be any other direction, if necessary.

EXAMPLE

An example associated with the junction-layer formation step S1 and the ion implantation step S2 will be described below. In this example, a GaN single crystal ingot 60 having a diameter of 2 inches (5.08 cm) and a thickness of 500 μm is grown by HVPE, which is used as a base material of a GaN thin film 40. The GaN single crystal ingot 60 has a primary surface of (0001) plane (which is the surface of the Ga plane) and a second surface of (000-1) plane (which is the surface of the N plane), and these surfaces are mirror finished.

Subsequently, a 100-nm thick $SiO_2$ layer functioning as a junction layer is formed on the surface of the N plane of the GaN single crystal ingot 60 by plasma CVD. The plasma CVD condition for the $SiO_2$ layer deposition is as follows: high-frequency (RF) power of 50 W; flow rate of $SiH_4$ gas (diluted to 8 volume percent with Ar gas) of 50 sccm (standard cubic centimeters per minute); $N_2O$ gas flow rate of 460 sccm; chamber pressure of 80 Pa; and stage temperature of 250 degrees Celsius.

Hydrogen ions are implanted through the $SiO_2$ layer into the surface of the N plane of the GaN single crystal ingot 60. The condition for hydrogen ion implantation is as follows: accelerating voltage of 50 keV and the dosage of $7 \times 10^{17}$ cm$^{-2}$. The peak level of a hydrogen profile is observed at a depth of approximately 200 nm from the surface of the N plate of the GaN single crystal ingot 60 through which the hydrogen ions are implanted. In order to measure the hydrogen profiles secondary ion mass spectrometry (SIMS) is applied to the above-described GaN single crystal ingot 60 and the other ion-implanted GaN single crystal ingot in the depth direction from the surface through the implantation has been performed.

The semiconductor optical device according to the present invention is not limited to the above-described embodiments, and can have various modifications. For example, in the above-described embodiments, a GaN substrate and a GaN thin film are respectively exemplified as a group III nitride semiconductor substrate and a group III nitride semiconductor thin film. The present invention can also be applied to substrates and thin films composed of other group III nitride semiconductors.

Having illustrated and described the principle of the present invention in the preferred embodiments, but it should be noted that it is understood by those skilled in the art that the present invention can be modified in arrangement and detail without departing from the principle of the invention. Therefore, the applicant claims all corrections and modifications resulting from the scope of claims and the scope of spirit thereof.

What is claimed is:

1. A semiconductor optical device comprising:
 a group III nitride semiconductor substrate including a primary surface, the primary surface having a first orientation;
 a first group III nitride semiconductor laminate including a first active layer and formed on a first region of the primary surface;
 a group III nitride semiconductor thin film including a surface, the surface thereof having a second orientation different from the first orientation, the group III nitride semiconductor thin film being joined to a second region of the primary surface using a junction layer therebetween, the second region being different from the first region of the primary surface; and
 a second group III nitride semiconductor laminate including a second active layer and formed on the surface of the group III nitride semiconductor thin film,
 the first active layer including a first well layer, the first well layer containing indium, the second active layer including a second well layer, and the second well layer containing indium, and
 an emission wavelength of the first well layer being different from that of the second well layer.

2. The semiconductor optical device according to claim 1, wherein an indium content of the first well layer is different from an indium content of the second well layer.

3. The semiconductor optical device according to claim 1, wherein
 the first group III nitride semiconductor laminate includes a first optical guide layer disposed along the first active layer,
 the second group III nitride semiconductor laminate includes a second optical guide layer disposed along the second active layer,
 the first optical guide layer and the second optical guide layer contain indium, and
 an indium content of the first optical guide layer is different from an indium content of the second optical guide layer.

4. The semiconductor optical device according to claim 1, wherein the emission wavelength of one of the first well layer and the second well layer is in a range of 430 to 480 nm.

5. The semiconductor optical device according to claim 1, wherein the emission wavelength of one of the first well layer and the second well layer is in a range of 500 to 550 nm.

6. The semiconductor optical device according to claim 1, wherein
 the emission wavelength of the first well layer is in a range of 500 to 550 nm, and
 the emission wavelength of the second well layer is in a range of 430 to 480 μm.

7. The semiconductor optical device according to claim 1, wherein
 the first group III nitride semiconductor laminate has an optical waveguide structure for lasing,
 a normal vector of the primary surface of the group III nitride semiconductor substrate is inclined toward a c-axis of a group III nitride semiconductor of the group III nitride semiconductor substrate, and
 an inclination direction of the c-axis of the group III nitride semiconductor substrate is orthogonal to a longitudinal direction of the optical waveguide structure of the first group III nitride semiconductor laminate.

8. The semiconductor optical device according to claim 1, wherein the primary surface of the group III nitride semiconductor substrate has one of a semipolar plane and a non-polar plane of a group III nitride semiconductor of the group III nitride semiconductor substrate.

9. The semiconductor optical device according to claim 8, wherein an angle between a normal vector of the surface of the group III nitride semiconductor substrate and a c-axis of the group III nitride semiconductor substrate is within a range of 10 to 80 degrees or 100 to 170 degrees.

10. The semiconductor optical device according to claim 9, wherein the angle between a normal vector of the primary surface of the group III nitride semiconductor substrate and the c-axis of the group III nitride semiconductor substrate is in a range of 63 to 80 degrees or 100 to 117 degrees.

11. The semiconductor optical device according to claim 1, wherein the junction layer comprises a conductive material.

12. The semiconductor optical device according to claim 1, wherein
 the indium content of the first well layer is different from the indium content of the second well layer,
 the first group III nitride semiconductor laminate includes a first optical guide layer disposed along the first active layer,
 the second group III nitride semiconductor laminate includes a second optical guide layer disposed along the second active layer,
 the first optical guide layer and the second optical guide layer contain indium, and
 the indium content of the first optical guide layer is different from the indium content of the second optical guide layer.

13. The semiconductor optical device according to claim 1, wherein
 the emission wavelength of light emitted from one of the first well layer and the second well layer is in a range of 430 to 480 nm, and
 the primary surface of the group III nitride semiconductor substrate has one of a semipolar plane and a non-polar plane of a group III nitride semiconductor of the group III nitride semiconductor substrate.

14. The semiconductor optical device according to claim 1, wherein
 the emission wavelength of light emitted from one of the first well layer and the second well layer is in a range of 500 to 550 nm, and the primary surface of the group III nitride semiconductor substrate has one of a semipolar plane and a non-polar plane of the group III nitride semiconductor substrate.

15. The semiconductor optical device according to claim 1, wherein the emission wavelength of light emitted from the first well layer is in a range of 500 to 550 nm, and the emission wavelength of light emitted from the second well layer is in a range of 430 to 480 nm, and the primary surface of the group III nitride semiconductor substrate has one of a semipolar plane and a non-polar plane of the group III nitride semiconductor substrate.

16. The semiconductor optical device according to claim 1, wherein the emission wavelength of light emitted from one of the first well layer and the second well layer is in a range of 430 to 480 nm, the first group III nitride semiconductor laminate has an optical waveguide structure for lasing, a normal vector of the primary surface of the group III nitride semiconductor substrate is inclined toward a c-axis of a group III nitride semiconductor of the group III nitride semiconductor substrate, and the inclination direction of the c-axis of the group III nitride semiconductor substrate is orthogonal to the longitudinal direction of the optical waveguide structure of the first group III nitride semiconductor laminate.

17. The semiconductor optical device according to claim 1, wherein the wavelength of light emitted from one of the first well layer and the second well layer is in a range of 500 to 550 nm, the first group III nitride semiconductor laminate has an optical waveguide structure for lasing, a normal vector of the primary surface of the group III nitride semiconductor substrate is inclined toward a c-axis of a group III nitride semiconductor of the group III nitride semiconductor substrate, and the inclination direction of the c-axis of the group III nitride semiconductor substrate is orthogonal to the longitudinal direction of the optical waveguide structure of the first group III nitride semiconductor laminate.

18. The semiconductor optical device according to claim 1, wherein the wavelength of light emitted from the first well layer is in a range of 500 to 550 nm, and the wavelength of light emitted from the second well layer is in a range of 430 to 480 nm, the first group III nitride semiconductor laminate has an optical waveguide structure for laser generation, a normal vector of the primary surface of the group III nitride semiconductor substrate is inclined toward a c-axis of a group III nitride semiconductor of the group III nitride semiconductor substrate, and the inclination direction of the c-axis of the group III nitride semiconductor substrate is orthogonal to the longitudinal direction of the optical waveguide structure of the first group III nitride semiconductor laminate.

19. The semiconductor optical device according to claim 1, wherein an angle between a normal vector of the primary surface of the group III nitride semiconductor substrate and a c-axis of the group III nitride semiconductor substrate is in a range of 10 to 80 degrees or 100 to 170 degrees, and the junction layer is composed of a conductive material.

20. The semiconductor optical device according to claim 1, wherein an angle between a normal vector of the primary surface of the group III nitride semiconductor substrate and a c-axis of the group III nitride semiconductor substrate is in a range of 63 to 80 degrees or 100 to 117 degrees, and the junction layer is composed of a conductive material.

* * * * *